US011469518B2

(12) United States Patent
Ichihara

(10) Patent No.: US 11,469,518 B2
(45) Date of Patent: Oct. 11, 2022

(54) ARRAY ANTENNA, SOLID-STATE IMAGING DEVICE, AND ELECTRONIC APPARATUS

(71) Applicant: SONY SEMICONDUCTOR SOLUTIONS CORPORATION, Kanagawa (JP)

(72) Inventor: Takuya Ichihara, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/047,588

(22) PCT Filed: Feb. 21, 2019

(86) PCT No.: PCT/JP2019/006448
§ 371 (c)(1),
(2) Date: Oct. 14, 2020

(87) PCT Pub. No.: WO2019/207927
PCT Pub. Date: Oct. 31, 2019

(65) Prior Publication Data
US 2021/0167519 A1  Jun. 3, 2021

(30) Foreign Application Priority Data
Apr. 27, 2018  (JP) .............................. JP2018-085921

(51) Int. Cl.
H01Q 21/06  (2006.01)
H01Q 21/24  (2006.01)
(Continued)

(52) U.S. Cl.
CPC ..... *H01Q 21/061* (2013.01); *H01L 27/14603* (2013.01); *H01Q 5/10* (2015.01); *H01Q 21/24* (2013.01); *H04N 5/369* (2013.01)

(58) Field of Classification Search
CPC ...... H01Q 21/06; H01Q 21/061; H01Q 21/08; H01Q 21/24; H01Q 21/245; H01Q 1/248; H01Q 1/36
See application file for complete search history.

(56) References Cited

U.S. PATENT DOCUMENTS 8,847,824 B2 * 9/2014 Kotter .................... H01Q 1/248
343/795
9,859,757 B1 * 1/2018 Leabman ............. H04B 5/0031
(Continued)

FOREIGN PATENT DOCUMENTS

EP  3046181 A2  7/2016
JP  05-264343 A  10/1993
(Continued)

OTHER PUBLICATIONS

International Search Report and Written Opinion of PCT Application No. PCT/JP2019/006448, dated May 21, 2019, 13 pages of ISRWO.

*Primary Examiner* — Jason Crawford
(74) *Attorney, Agent, or Firm* — Chip Law Group

(57) ABSTRACT

The size of a solid-state imaging device that captures images is reduced. The solid-state imaging device includes an array antenna. A plurality of rectifying antenna circuits is arranged in the array antenna. Each of the plurality of rectifying antenna circuits includes a rectifying antenna and a pixel signal generating unit. The pixel signal generating unit includes a floating diffusion layer, a transfer transistor that transfers charge from the rectifying antenna to the floating diffusion layer in accordance with a transfer signal, a reset transistor that initializes the amount of charge in the floating diffusion layer in accordance with a reset signal, an amplification transistor that amplifies a voltage corresponding to the amount of charge accumulated in the floating diffusion
(Continued)

layer, and a selection transistor that outputs a signal of the amplified voltage as a pixel signal in accordance with a selection signal.

12 Claims, 25 Drawing Sheets

(51) Int. Cl.
    *H01Q 5/10*         (2015.01)
    *H01L 27/146*    (2006.01)
    *H04N 5/369*     (2011.01)

(56) References Cited

U.S. PATENT DOCUMENTS

| | | | | |
|---|---|---|---|---|
| 10,135,123 | B1* | 11/2018 | Arnitz | H01Q 1/247 |
| 2011/0121258 | A1* | 5/2011 | Hanein | H01L 29/86 |
| | | | | 977/950 |
| 2014/0290950 | A1* | 10/2014 | Welsh | H01Q 7/00 |
| | | | | 307/151 |
| 2014/0320378 | A1* | 10/2014 | Gracias | H01Q 21/00 |
| | | | | 343/893 |
| 2015/0372029 | A1* | 12/2015 | Cooke | H02J 7/00 |
| | | | | 315/152 |
| 2016/0118186 | A1 | 4/2016 | Frimpong et al. | |
| 2016/0181867 | A1* | 6/2016 | Daniel | H01Q 9/26 |
| | | | | 307/104 |
| 2016/0181868 | A1* | 6/2016 | Casse | H01Q 1/248 |
| | | | | 307/104 |
| 2018/0198320 | A1* | 7/2018 | Criswell | H01Q 13/0241 |
| 2021/0167519 | A1* | 6/2021 | Ichihara | H04N 5/369 |

FOREIGN PATENT DOCUMENTS

| | | |
|---|---|---|
| JP | 2015-153975 A | 8/2015 |
| JP | 2016-119666 A | 6/2016 |
| KR | 10-2016-0076978 A | 7/2016 |

* cited by examiner

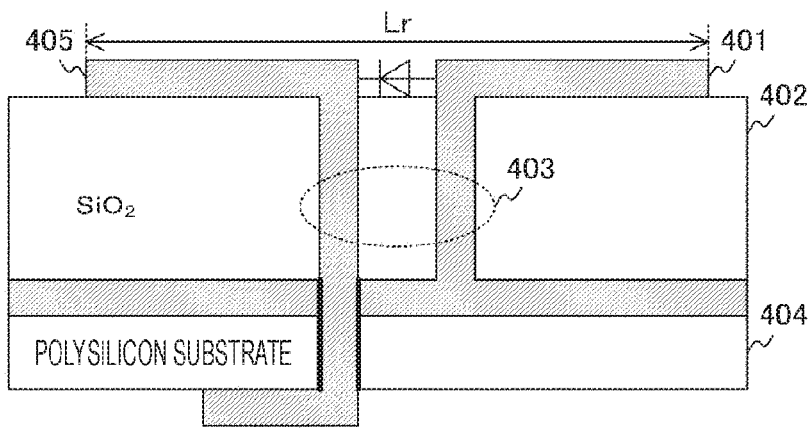
FIG. 7A
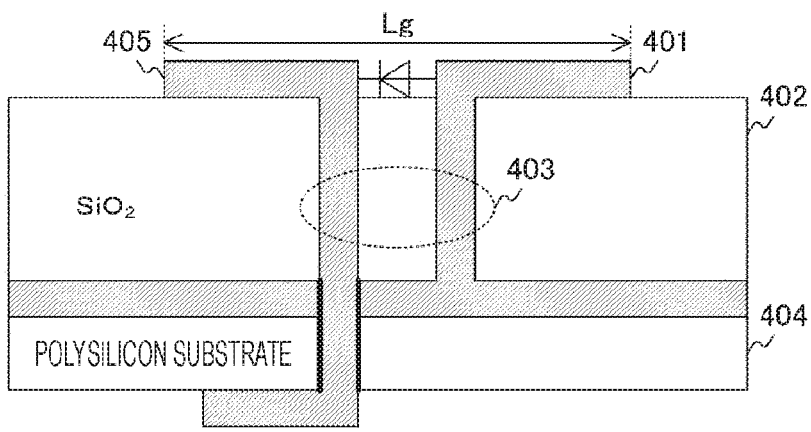
FIG. 7B
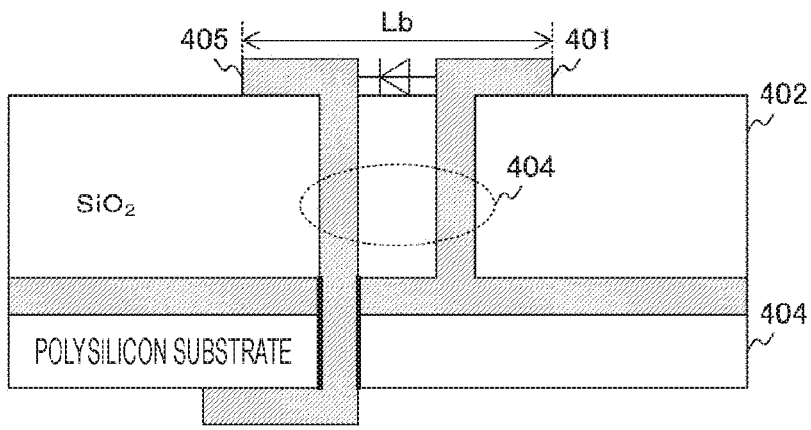
FIG. 7C
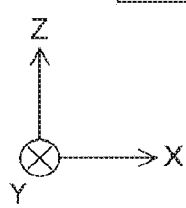

ARRAY ANTENNA, SOLID-STATE IMAGING DEVICE, AND ELECTRONIC APPARATUS

CROSS REFERENCE TO RELATED APPLICATIONS

This application is a U.S. National Phase of International Patent Application No. PCT/JP2019/006448 filed on Feb. 21, 2019, which claims priority benefit of Japanese Patent Application No. JP 2018-085921 filed in the Japan Patent Office on Apr. 27, 2018. Each of the above-referenced applications is hereby incorporated herein by reference in its entirety.

TECHNICAL FIELD

The present technology relates to an array antenna, a solid-state imaging device, and an electronic apparatus. Specifically, the present technology relates to an array antenna in which rectifying antennas are arranged, a solid-state imaging device, and an electronic apparatus.

BACKGROUND ART

Conventionally, a solid-state imaging device that performs photoelectric conversion with a photodiode to capture image data has been used in an electronic apparatus having an imaging function. For example, a solid-state imaging device in which a microlens, a color filter, and a photodiode are disposed for each pixel has been proposed (for example, see Patent Document 1).

CITATION LIST

Patent Document

Patent Document 1: Japanese Patent Application Laid-Open No. 2015-153975

SUMMARY OF THE INVENTION

Problems to be Solved by the Invention

In the related art described above, a pixel signal of red (R), green (G), blue (B), or the like can be generated to capture color image data by disposing a plurality of color filters each allowing light having a particular wavelength range to pass through. However, the solid-state imaging device described above occupies a larger area as the number of pixels is increased. A method for suppressing the increase in area may be forming a layered structure, but the layered structure involves a greater thickness. Thus, the above-described solid-state imaging device has difficulty in reducing the size of the entire solid-state imaging device.

The present technology has been created in view of such circumstances, and is intended to reduce the size of a solid-state imaging device that captures an image.

Solutions to Problems

The present technology has been made in order to solve the above-described problems, and a first aspect of the present technology is an array antenna including a first rectifying antenna and a second rectifying antenna that differs from the first rectifying antenna in shape. A resulting effect is that light having different wavelengths is converted into electric signals.

Furthermore, in the first aspect, the first rectifying antenna and the second rectifying antenna may be arranged on a predetermined plane. A resulting effect is that light emitted onto the predetermined plane is converted into electric signals.

Furthermore, in the first aspect, a third rectifying antenna that differs from the first rectifying antenna and the second rectifying antenna in shape can further be included. A resulting effect is that three rays of light having different wavelengths are converted into electric signals.

Furthermore, in the first aspect, a fourth rectifying antenna that differs from the first rectifying antenna, the second rectifying antenna, and the third rectifying antenna in shape can further be included. A resulting effect is that four rays of light having different wavelengths are converted into electric signals.

Furthermore, in the first aspect, a fifth rectifying antenna that differs from the first rectifying antenna, the second rectifying antenna, the third rectifying antenna, and the fourth rectifying antenna in shape can further be included. A resulting effect is that five rays of light having different wavelengths are converted into electric signals.

Furthermore, in the first aspect, the array antenna may be divided into a first unit array and a second unit array; each of the first rectifying antenna and the second rectifying antenna may include a pair of rods; the first rectifying antenna and the second rectifying antenna may be disposed in each of the first unit array and the second unit array; in the first unit array, the pair of rods may be arranged along a predetermined direction; and in the second unit array, the pair of rods may be arranged along a direction perpendicular to the predetermined direction. A resulting effect is that polarized light is converted into electric signals.

Furthermore, in the first aspect, the array antenna may be rectangular, and the predetermined direction may be a direction parallel to one side of the array antenna. A resulting effect is that horizontally polarized light and vertically polarized light are converted into electric signals.

Furthermore, in the first aspect, the array antenna may be rectangular, and the predetermined direction may form an angle of 45 degrees with one side of the array antenna. A resulting effect is that rectifying antennas are arranged without a gap.

Furthermore, in the first aspect, in at least one of the first unit array or the second unit array, the second rectifying antennas, the number of which is at least two, may be disposed, and the first rectifying antenna may be longer than each of the second rectifying antennas and may be disposed between the second rectifying antennas. A resulting effect is that rectifying antennas are arranged with higher area efficiency.

Furthermore, in the first aspect, one of the first unit array and the second unit array may be in a rectangular shape and the other one may be in a triangular shape. A resulting effect is that a free area for disposing a photodiode and the like is provided.

Furthermore, in the first aspect, each of the first unit array and the second unit array may be in a triangular shape. A resulting effect is that a free area for disposing a photodiode and the like is provided.

Furthermore, in the first aspect, a free area in which no rectifying antenna is disposed may further be provided, and the free area may be in a triangular shape. A resulting effect is that a photodiode and the like are disposed in the triangular free area.

Furthermore, in the first aspect, a free area in which no rectifying antenna is disposed may further be provided, and the free area may be in a rectangular shape. A resulting effect is that a photodiode and the like are disposed in the rectangular free area.

Furthermore, in the first aspect, a third rectifying antenna that differs from the first rectifying antenna and the second rectifying antenna in shape may further be included; the first rectifying antenna may receive red light; the second rectifying antenna may receive green light; the third rectifying antenna may receive blue light; and the first rectifying antenna, the second rectifying antenna, and the third rectifying antenna may be arranged in a Bayer array. A resulting effect is that image data in a Bayer array is captured.

Furthermore, in the first aspect, a third rectifying antenna that differs from the first rectifying antenna and the second rectifying antenna in shape and a pixel circuit that receives white light may further be included; the first rectifying antenna may receive red light; the second rectifying antenna may receive green light; and the third rectifying antenna may receive blue light. A resulting effect is that red, green, blue, and white pixel signals are generated.

Furthermore, in the first aspect, the array antenna may be divided into a plurality of unit blocks; and the first rectifying antenna, the second rectifying antenna, the third rectifying antenna, and the pixel circuit may be arranged in a two-dimensional lattice in each of the plurality of unit blocks. A resulting effect is that the same number of red pixel signals, green pixel signals, blue pixel signals, and white pixel signals are generated.

Furthermore, in the first aspect, the array antenna may be divided into a plurality of first unit blocks and a plurality of second unit blocks; the first rectifying antenna, the third rectifying antenna, and a pair of the pixel circuits may be arranged in a two-dimensional lattice in each of the plurality of first unit blocks; and a pair of the second rectifying antennas and a pair of the pixel circuits may be arranged in a two-dimensional lattice in each of the plurality of second unit blocks. A resulting effect is that different numbers of red pixel signals, green pixel signals, blue pixel signals, and white pixel signals are generated.

Furthermore, in the first aspect, the array antenna may be divided into a plurality of first unit blocks, a plurality of second unit blocks, and a plurality of third unit blocks; a pair of the first rectifying antennas and a pair of the pixel circuits may be arranged in a two-dimensional lattice in each of the plurality of first unit blocks; a pair of the second rectifying antennas and a pair of the pixel circuits may be arranged in a two-dimensional lattice in each of the plurality of second unit blocks; and a pair of the third rectifying antennas and a pair of the pixel circuits may be arranged in a two-dimensional lattice in each of the plurality of third unit blocks. A resulting effect is that different numbers of red pixel signals, green pixel signals, blue pixel signals, and white pixel signals are generated.

Furthermore, in the first aspect, a pixel circuit that receives white light may further be included; the array antenna may be divided into a plurality of unit blocks; the first rectifying antenna may receive red light; the second rectifying antenna may receive blue light; and the first rectifying antenna, the second rectifying antenna, and a pair of the pixel circuits may be arranged in a two-dimensional lattice in each of the plurality of unit blocks. A resulting effect is that red, blue, and white pixel signals are generated.

Furthermore, a second aspect of the present technology is a solid-state imaging device including an array antenna in which a predetermined number of rectifying antennas are arranged. A resulting effect is that light is converted into electric signals by means of a rectifying antenna.

Furthermore in the second aspect, a plurality of rectifying antenna circuits may be arranged in the array antenna, each of the plurality of rectifying antenna circuits may include: the rectifying antenna; and a pixel signal generating unit, and the pixel signal generating unit may include: a floating diffusion layer that accumulates charge and generates a voltage corresponding to the amount of charge; a transfer transistor that transfers the charge from the rectifying antenna to the floating diffusion layer in accordance with a transfer signal; a reset transistor that initializes the amount of charge in the floating diffusion layer in accordance with a reset signal; an amplification transistor that amplifies the voltage; and a selection transistor that outputs a signal of the voltage that has been amplified as a pixel signal in accordance with a selection signal. A resulting effect is that a pixel signal is generated.

Furthermore, a third aspect of the present technology is an electronic apparatus including: an array antenna in which a plurality of rectifying antenna circuits is arranged; and a signal processing unit that processes a pixel signal generated by each of the plurality of rectifying antenna circuits. A resulting effect is that an image is captured by means of a plurality of rectifying antenna circuits.

Effects of the Invention

According to the present technology, an excellent effect of reducing the size of a solid-state imaging device that captures an image can be provided. Note that the effects described above are not restrictive, and any of effects described in the present disclosure may be included.

BRIEF DESCRIPTION OF DRAWINGS

FIGS. 7A, 7B, and 7C are examples of cross-sectional views of an R rectenna circuit, a G rectenna circuit, and a B rectenna circuit according to the first embodiment of the present technology.

MODE FOR CARRYING OUT THE INVENTION

A mode for carrying out the present technology (hereinafter referred to as an embodiment) will now be described. Descriptions are provided in the order mentioned below.

1. First embodiment (example in which rectennas are arranged)
2. Second embodiment (example in which rectennas are arranged to receive visible light and ultraviolet light)
3. Third embodiment (example in which rectennas are arranged to receive infrared light, visible light, and ultraviolet light)
4. Fourth embodiment (example in which rectennas are arranged to receive red light, green light, blue light, and white light)
5. Fifth embodiment (example in which rectennas are arranged in Bayer array)
6. Example of application to mobile body 1. First Embodiment

[Example Configuration of Electronic Apparatus]

Figure 1:
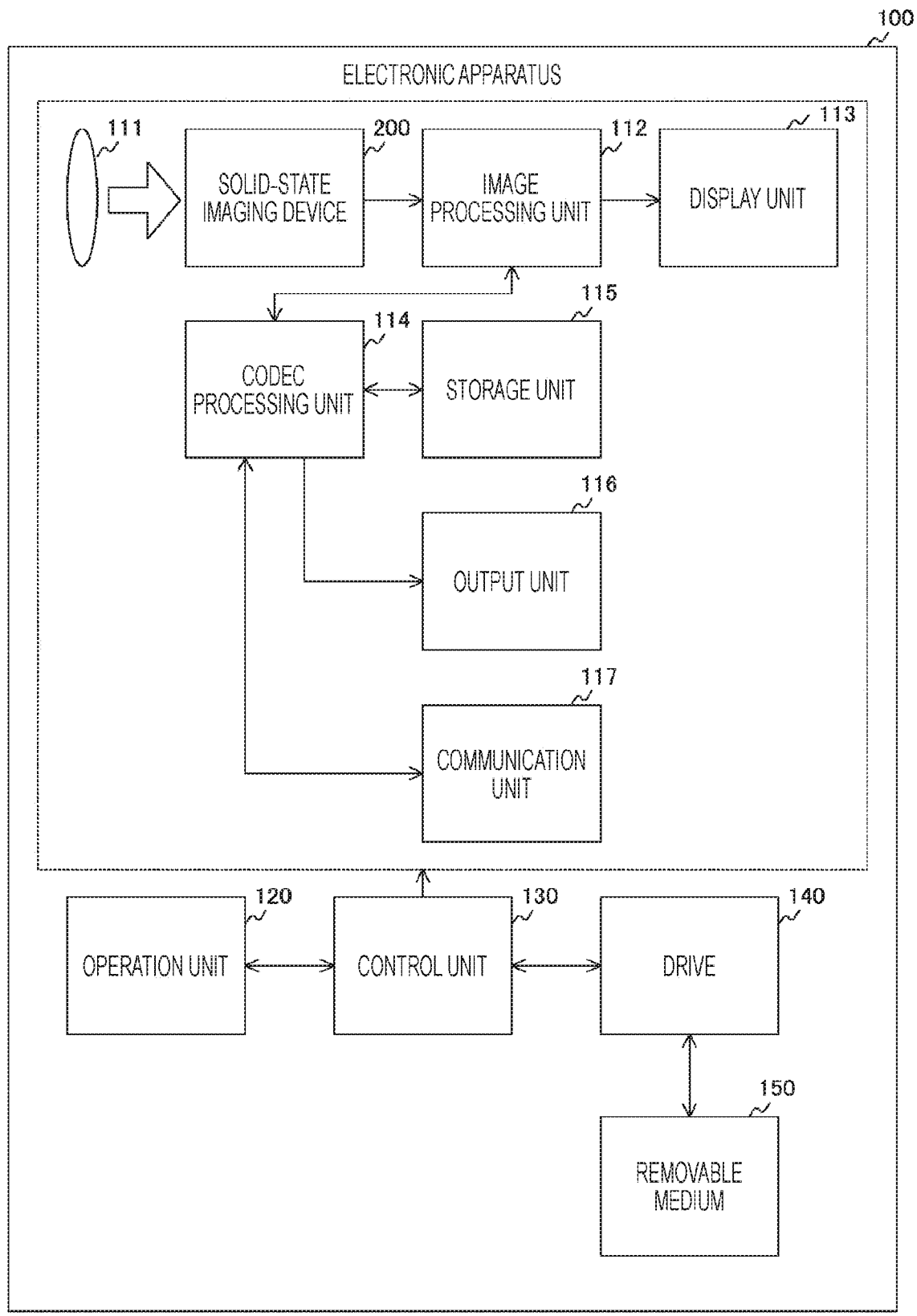
FIG. 1 is a block diagram illustrating an example configuration of an electronic apparatus according to a first embodiment of the present technology.

FIG. 1 is a block diagram illustrating an example configuration of an electronic apparatus 100 according to a first embodiment of the present technology. The electronic apparatus 100, which is a device for capturing image data, includes an optical unit 111, a solid-state imaging device 200, an image processing unit 112, a display unit 113, a codec processing unit 114, a storage unit 115, an output unit 116, and a communication unit 117. Furthermore, the electronic apparatus 100 includes an operation unit 120, a control unit 130, a drive 140, and a removable medium 150. A camera, a smartphone, a personal computer, or the like is conceived as the electronic apparatus 100.

The optical unit 111 collects light from a subject and guides the light to the solid-state imaging device 200. The solid-state imaging device 200 captures image data under the control of the control unit 130. The solid-state imaging device 200 supplies the captured image data to the image processing unit 112.

The image processing unit 112 performs image processing on the image data. The image processing unit 112 performs various types of image processing on the image data, such as color contamination correction, black level correction, white balance adjustment, demosaicing, matrix processing, gamma correction, YC conversion, and the like. Then, the image processing unit 112 supplies the image data that has undergone the image processing to the display unit 113. The display unit 113 displays the image data.

The codec processing unit 114 performs a coding process in accordance with a predetermined method on the image data from the image processing unit 112, and supplies the resulting coded data to the storage unit 115. Furthermore, the codec processing unit 114 reads the coded data recorded in the storage unit 115, decodes the coded data to generate decoded image data, and supplies the decoded image data to the image processing unit 112.

Furthermore, if necessary, the codec processing unit 114 supplies the coded data or decoded image data to the output unit 116 so that the data is output to the outside of the electronic apparatus 100. In addition, if necessary, the codec processing unit 114 supplies the coded data or decoded image data to the communication unit 117 so that the data is transmitted to the outside. Alternatively, the codec processing unit 114 performs coding or decoding on the data from the communication unit 117, and supplies the resulting data to the storage unit 115, the output unit 116, or the image processing unit 112.

The operation unit 120, which includes, for example, a dial, a key, a button, a touch panel, or any other input device, receives, for example, an operation input given by a user or the like and supplies a signal corresponding to the operation input to the control unit 130.

The control unit 130 controls operations of the individual processing units enclosed by a dotted line in the electronic apparatus 100 (such as the solid-state imaging device 200), the operation unit 120, and the drive 140.

The drive 140 accesses the removable medium 150. The drive 140 reads various types of information such as programs and data from the removable medium 150, and supplies the information to the control unit 130. Furthermore, the drive 140 causes the removable medium 150 to store various types of information from the control unit 130. The removable medium 150 is a removable recording medium.

[Example Configuration of Solid-State Imaging Device]

Figure 2:
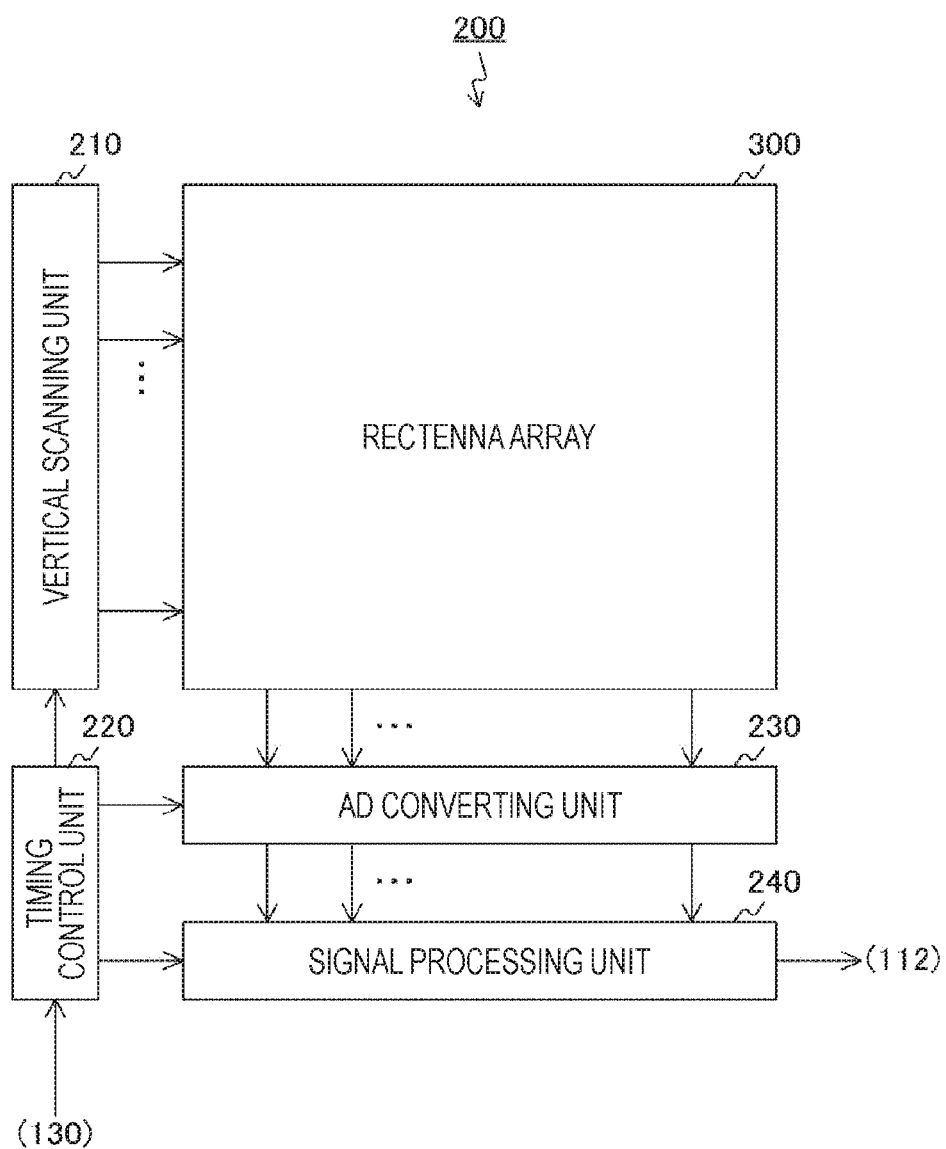
FIG. 2 is a block diagram illustrating an example configuration of a solid-state imaging device according to the first embodiment of the present technology.

FIG. 2 is a block diagram illustrating an example configuration of the solid-state imaging device 200 according to the first embodiment of the present technology. The solid-state imaging device 200 includes a vertical scanning unit 210, a rectenna array 300, a timing control unit 220, an AD converting unit 230, and a signal processing unit 240.

Here, the solid-state imaging device 200 employs, in order to reduce the size thereof, a rectenna circuit instead of a pixel circuit that includes a photodiode. The rectenna circuit includes a rectenna and a pixel signal generating unit that generates an analog pixel signal. A rectenna, which is an abbreviation for a rectifying antenna, is an antenna element that converts an electromagnetic wave into a direct current through a rectifying action of a diode. In order to generate image data, the solid-state image element 200 includes the rectenna array 300 in which a plurality of rectenna circuits is arranged. A circuit like the rectenna array 300 in which a plurality of antenna elements (rectennas) is arranged in this way is also called an array antenna. Note that the rectenna array 300 is an example of the array antenna described in the claims.

The vertical scanning unit 210 sequentially drives the rectenna circuits in the rectenna array 300 to output pixel signals.

Under the control of the control unit 130, the timing control unit 220 controls the operation timing of each of the vertical scanning unit 210, the AD converting unit 230, and the signal processing unit 240.

The analog to digital (AD) converting unit 230 converts an analog pixel signal from the rectenna array 300 into a digital signal. The AD converting unit 230 supplies digital signals to the signal processing unit 240.

The signal processing unit 240 performs various type of signal processing, such as correlated double sampling (CDS) processing, on the digital signals from the AD converting unit 230. The signal processing unit 240 supplies image data including digital signals that have undergone signal processing to the image processing unit 112.

[Example Configuration of Rectenna Array]

Figure 3:
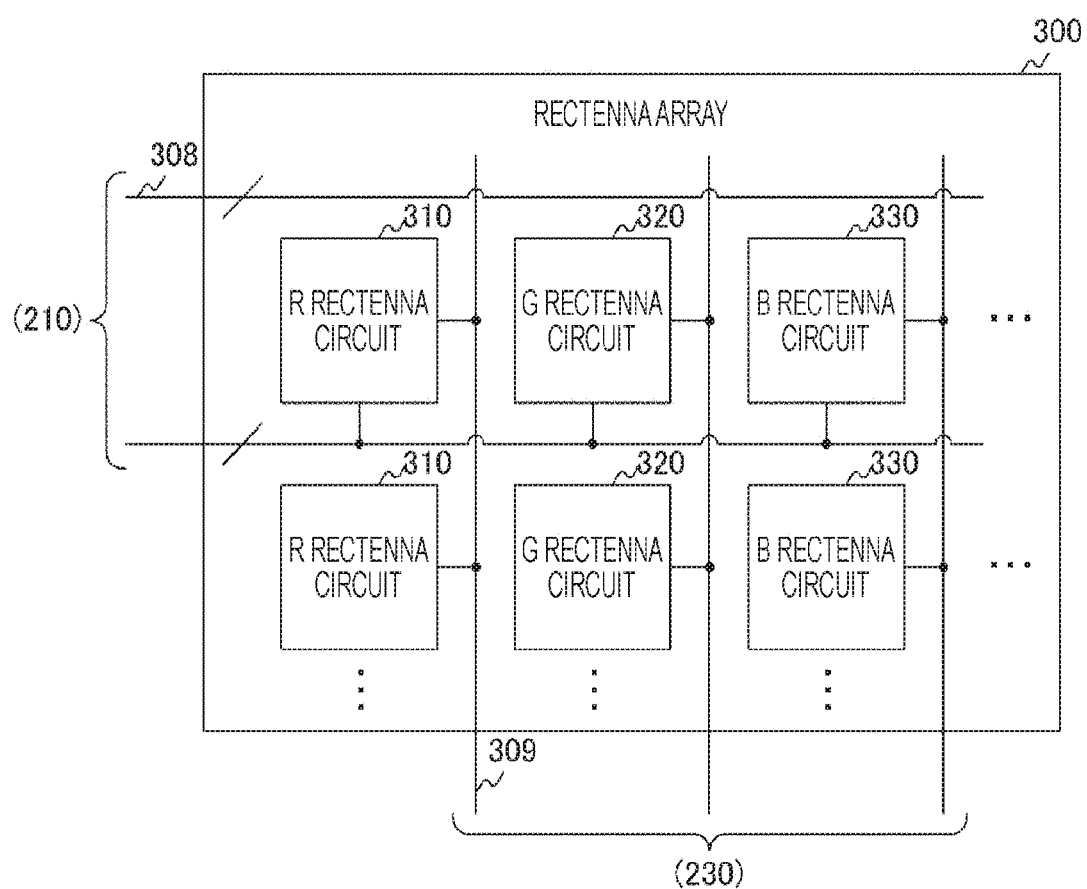
FIG. 3 is a block diagram illustrating an example configuration of a rectenna array according to the first embodiment of the present technology.

FIG. 3 is a block diagram illustrating an example configuration of the rectenna array 300 according to the first embodiment of the present technology. In the rectenna array 300, a plurality of R rectenna circuits 310, a plurality of G rectenna circuits 320, and a plurality of B rectenna circuits 330 are arranged.

Under the control of the vertical scanning unit 210, the R rectenna circuit 310 converts red light into an electric signal. Under the control of the vertical scanning unit 210, the G rectenna circuit 320 converts green light into an electric signal. Under the control of the vertical scanning unit 210, the B rectenna circuit 330 converts blue light into an electric signal. These R rectenna circuits 310, G rectenna circuits 320, and B rectenna circuits 330 output converted electric signals, as pixel signals, to the AD converting unit 230.

[Example Configuration of Rectenna Circuit]

Figure 4:
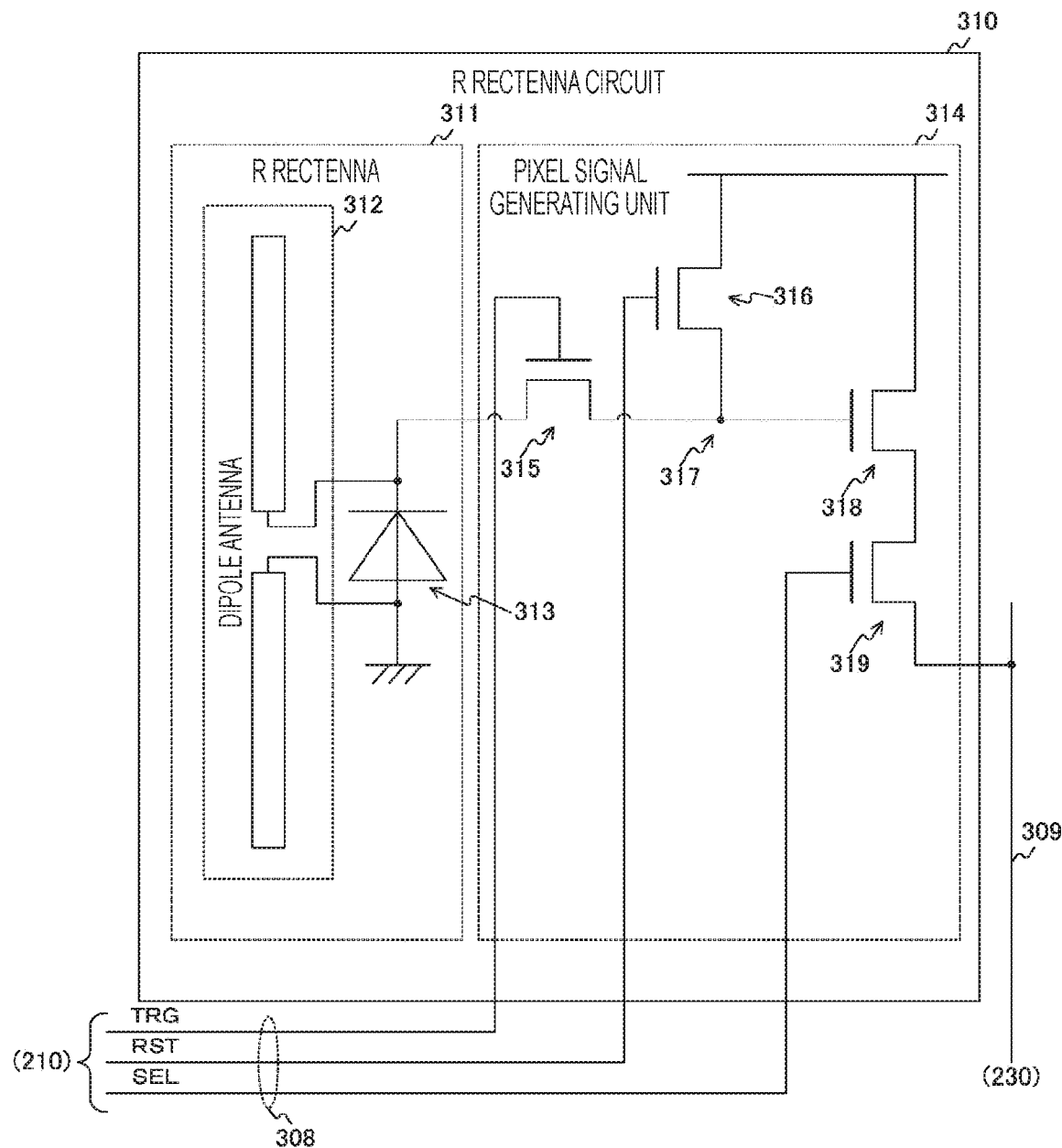
FIG. 4 is a circuit diagram illustrating an example configuration of an R rectenna circuit according to the first embodiment of the present technology.

FIG. 4 is a circuit diagram illustrating an example configuration of the R rectenna circuit 310 according to the first embodiment of the present technology. The R rectenna circuit 310 includes an R rectenna 311 and a pixel signal generating unit 314.

The R rectenna 311 receives red light and converts the red light into a direct current. The R rectenna 311 includes a dipole antenna 312 and a Schottky diode 313. The dipole antenna 312, which is an antenna including a pair of rods, resonates with light (in other words, receives light) having a predetermined wavelength corresponding to the length of the rod to generate a current. The rod is long and thin, and resonates with (receives) light having a longer wavelength as the rod has a longer dimension. A rod having a length corresponding to the wavelength of red is used here.

The Schottky diode 313 rectifies the current generated by the dipole antenna 312.

The pixel signal generating unit 314 generates a pixel signal from the direct current generated by the R rectenna 311. The pixel signal generating unit 314 includes a transfer transistor 315, a reset transistor 316, a floating diffusion layer 317, an amplification transistor 318, and a selection transistor 319.

The transfer transistor 315 transfers charge from the R rectenna 311 to the floating diffusion layer 317 in accordance with a transfer signal TRG from the vertical scanning unit 210.

The floating diffusion layer 317 accumulates charge and generates a voltage corresponding to the amount of charge.

The reset transistor 316 draws the charge out of the floating diffusion layer 317 to the power supply in accordance with a reset signal RST from the vertical scanning unit 210 to initialize the amount of charge therein.

The amplification transistor 318 amplifies the voltage generated in the floating diffusion layer 317. In accordance with a selection signal SEL from the vertical scanning unit 210, the selection transistor 319 supplies a signal of the amplified voltage, as a pixel signal, to the AD converting unit 230 via a vertical signal line 309.

Note that configurations of the G rectenna circuit 320 and the B rectenna circuit 330 are similar to the configuration of the R rectenna circuit 310 except that the shapes (that is, the lengths) of the rectennas are different. Note that the R rectenna circuit 310, the G rectenna circuit 320, and the B rectenna circuit 330 are examples of the rectifying antenna circuit described in the claims.

Furthermore, although four transistors are disposed in the pixel signal generating unit 314, this configuration is not restrictive as long as pixel signals can be generated. For example, one floating diffusion layer may be shared by a plurality of rectenna circuits. In this case, a rectenna and a transfer transistor are provided in each rectenna circuit, and the floating diffusion layer and the three transistors other than the transfer transistor are shared by the plurality of rectenna circuits.

Figure 5:
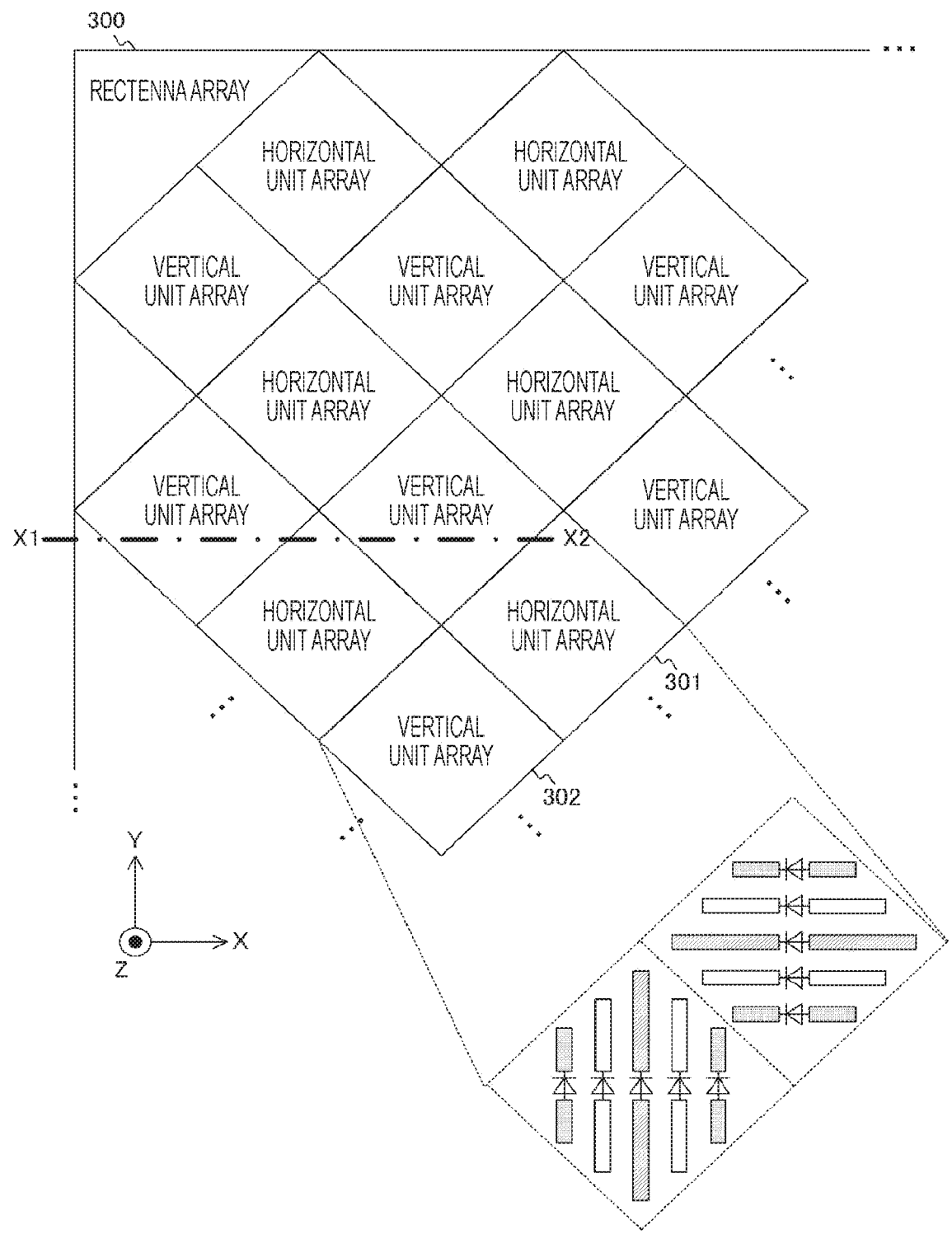
FIG. 5 is an example of a plan view of a rectenna array according to the first embodiment of the present technology.

FIG. 5 is an example of a plan view of the rectenna array 300 according to the first embodiment of the present technology. The rectenna array 300 is rectangular as seen from the optical axis direction of the optical unit 111, and has a predetermined plane perpendicular to the optical axis. In addition, a plurality of horizontal unit arrays 301 and a plurality of vertical unit arrays 302 are arranged on the plane of the rectenna array 300. The horizontal unit arrays 301 and the vertical unit arrays 302 are each in a rectangular shape (such as rhombus).

Hereinafter the X direction denotes a direction parallel to one side of the rectangular rectenna array 300 and the Z direction denotes the optical axis direction. Furthermore, the Y direction denotes a direction perpendicular to the X direction and to the Z direction. The horizontal unit arrays 301 and the vertical unit arrays 302 are alternately arranged along an oblique direction forming an angle of 45 degrees with the X direction.

Furthermore, in each of the horizontal unit arrays 301, a plurality of (five, for example) rectennas are arranged and a pair of rods in these rectennas are arranged along the X direction. In each of the vertical unit arrays 302, a plurality of (five, for example) rectennas are arranged and a pair of rods in these rectennas are arranged along the Y direction.

Figure 6:
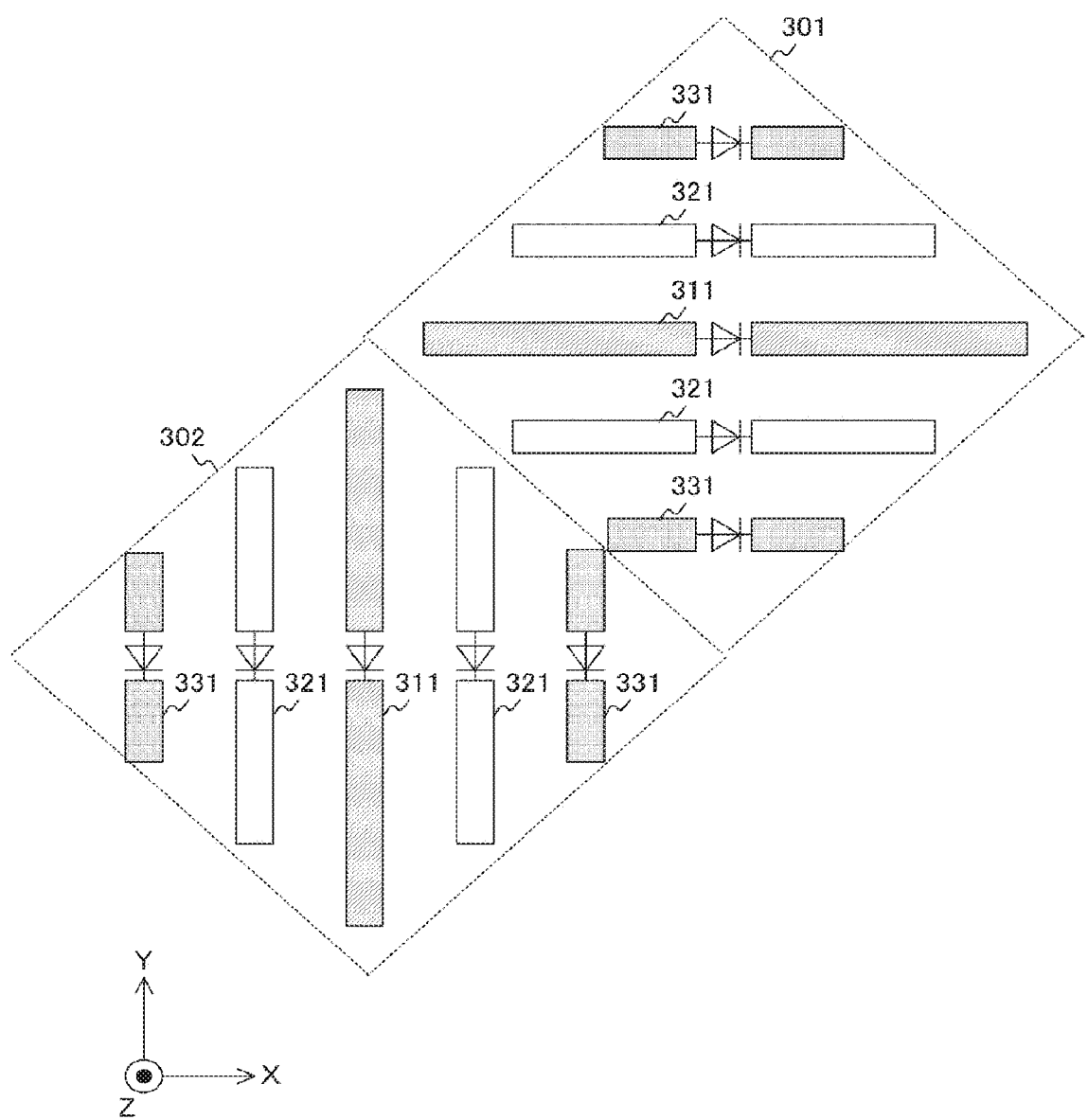
FIG. 6 is an example of an enlarged view of a horizontal unit array and a vertical unit array according to the first embodiment of the present technology.

FIG. 6 is an example of an enlarged view of the horizontal unit array 301 and the vertical unit array 302 according to the first embodiment of the present technology. In the horizontal unit array 301, one R rectenna 311, two G rectennas 321, and two B rectennas 331 are arranged.

The G rectenna 321 is a rectenna in the G rectenna circuit 320, and the B rectenna 331 is a rectenna in the B rectenna circuit 330. In practice, as illustrated in FIG. 4, a rectenna and a pixel signal generating unit are disposed in each of the R rectenna circuit 310, the G rectenna circuit 320, and the B rectenna circuit 330. However, for convenience of description, the pixel signal generating unit in each rectenna circuit is omitted in FIG. 6.

Furthermore, as described above, the length dimension of the rectenna is set to a larger value as the wavelength of light to be received is longer. Accordingly, the G rectenna 321 that receives green light is longer than the B rectenna 331 that receives blue light, and the R rectenna 311 that receives red light is longer than the G rectenna 321. For efficient arrangement of these rectennas, for example, a longer rectenna is disposed between shorter rectennas. For example, two G rectennas 321 and an R rectenna 311 are disposed between the shortest two B rectennas 331, and the longest R rectenna 311 is disposed between the G rectennas 321. In other words, the G rectennas 321 are disposed on both sides of the R rectenna 311, and the B rectennas 331 are disposed on both sides of the R rectenna 311 and the G rectennas 321. Furthermore, the center points of these rectennas are substantially the same with respect to the X direction. As a result of this arrangement, the horizontal unit array 301 is in a rhombic shape.

Likewise, in the vertical unit array 302, one R rectenna 311, two G rectennas 321, and two B rectennas 331 are arranged. These rectennas are arranged in a similar manner to the rectennas in the horizontal unit array 301 except that pairs of rods are arranged along the Y direction.

Note that the R rectenna 311 is an example of the first rectifying antenna described in the claims. The G rectenna 321 is an example of the second rectifying antenna described in the claims. The B rectenna 331 is an example of the third rectifying antenna described in the claims. The horizontal unit array 301 is an example of the first unit array described in the claims, while the vertical unit array 302 is an example of the second unit array described in the claims.

In addition, although one R rectenna 311, two G rectennas 321, and two B rectennas 331 are disposed in each of the horizontal unit array 301 and the vertical unit array 302, each number of rectennas is not limited to one or two. For example, two R rectennas 311 may be disposed. Furthermore, four G rectennas 321 and four B rectennas 331 may be disposed. In these cases, a longer rectenna is still disposed between shorter rectennas for higher area efficiency.

FIGS. 7A, 7B, and 7C are examples of cross-sectional views of the R rectenna circuit 310, the G rectenna circuit 320, and the B rectenna circuit 330 according to the first embodiment of the present technology. FIG. 7A is an example of a cross-sectional view of the R rectenna circuit 310 seen from the Y direction, and FIG. 7B is an example of a cross-sectional view of the G rectenna circuit 320 seen from the Y direction. FIG. 7C is an example of a cross-sectional view of the B rectenna circuit 330 seen from the Y direction. Note that the Schottky diodes shown in the figure are each illustrated for convenience to indicate a connection relationship with a dipole antenna, without indicating the actual position where the Schottky diode is mounted.

As illustrated in FIG. 7A, a metal 401 is wired along the X direction on the light-receiving surface of a silicon dioxide layer 402. The metal 401 in the middle is routed to pass through the silicon dioxide layer 402 along the Z direction, and the rest of the metal is wired along the boundary between the silicon dioxide layer 402 and a polysilicon substrate 404. Furthermore, a metal 405 is wired along the X direction on the light receiving surface, routed in the middle to pass through the silicon dioxide layer 402 and the polysilicon substrate 404 along the Z direction, and the rest of the metal is wired along the surface of the polysilicon substrate 404.

On the light-receiving surface, the metals 401 and 405 wired along the X direction function as the dipole antenna 312. The length of the dipole antenna, that is, the length Lr from an end of the metal 401 to an end of the metal 405 is, for example, about 300 nanometers (nm). Furthermore, a circuit that includes a capacitance 403 generated between the metals 401 and 405 wired along the Z direction and a wiring resistance functions as a low-pass filter. The length (that is, the depth) of the wiring running along the Z direction and being used as a low-pass filter is, for example, about 100 to 200 nanometers (nm).

In addition, as illustrated in FIG. 7B, the G rectenna circuit 320 has a shorter rod than the R rectenna circuit 310, and the length Lg of the dipole antenna is about 200 to 250 nanometers (nm). In addition, as illustrated in FIG. 7C, the B rectenna circuit 330 has a shorter rod than the G rectenna circuit 320, and the length Lb of the dipole antenna is about 150 to 200 nanometers (nm).

As described above, a rectenna circuit such as the R rectenna circuit 310 can selectively receive a desired wavelength by adjusting the length of the rectenna, thus requiring no color filter.

Furthermore, since the rods in the horizontal unit array 301 are arranged along the X direction, the horizontal unit array 301 has higher sensitivity to horizontally polarized light on the assumption that the X direction is the horizontal direction. On the other hand, since the rods in the vertical unit array 302 are arranged along the Y direction, the vertical unit array 302 has higher sensitivity to vertically polarized light on the assumption that the Y direction is the vertical direction. Therefore, the need for a polarization filter for passing the horizontally or vertically polarized waves of light (that is, polarized light) is eliminated.

Therefore, as compared with a solid-state imaging device that generates a color image with a color filter, a polarization filter, and a photodiode, the thickness along the Z direction can be reduced (that is, the device can be made thinner) by the amount needed by these filters.

Moreover, since there is no need to provide optical filters including a color filter, a polarization filter, and the like, the manufacturing cost of the solid-state imaging device can be reduced by the amount needed for providing these optical filters.

Figure 8:
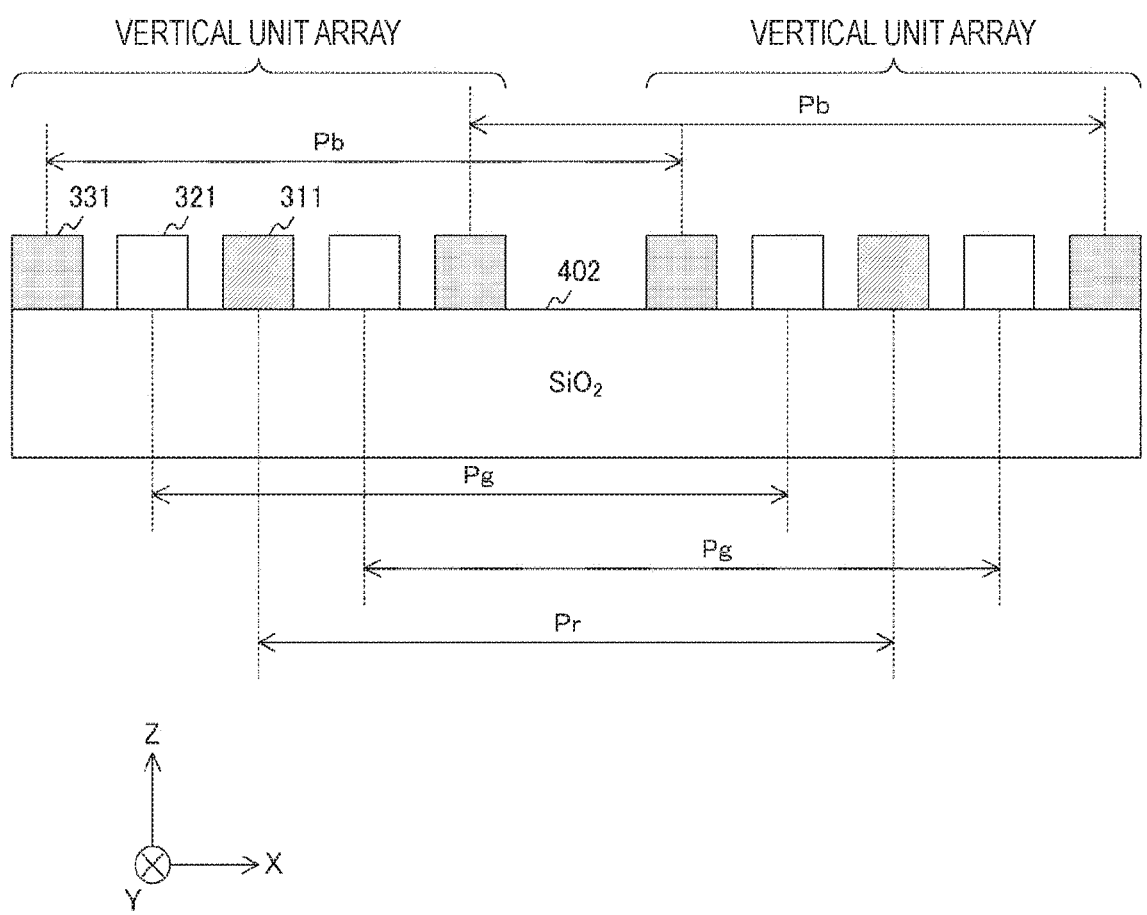
FIG. 8 is an example of a cross-sectional view of a rectenna array according to the first embodiment of the present technology.

FIG. 8 is an example of a cross-sectional view of the rectenna array 300 according to the first embodiment of the present technology. The cross-sectional view is a cross-sectional view of the rectenna array 300 taken along the line X1-X2 in FIG. 5 and seen from the Y direction.

Since one R rectenna 311 is disposed in each unit array, the distance between the centers of the two adjacent R rectennas 311 (that is, the pitch) is fixed and the value of the distance is represented by Pr.

On the other hand, two G rectennas 321 and two B rectennas 331 are disposed in each unit array. Therefore, in two adjacent unit arrays, the pitches between the G rectennas 321 at the same relative position and between the B rectennas 331 at the same relative position are fixed and the values of the pitches are represented by Pg and Pb, respectively. For example, attention is paid to the G rectenna 321 on the left side of the R rectenna 311 in the left vertical unit array of the two adjacent vertical unit arrays. Likewise, attention is paid to the G rectenna 321 on the left side of the R rectenna 311 in the right vertical unit array of the two vertical unit arrays. These G rectennas 321 are at the same relative position in their respective unit arrays. Therefore, the pitch between these G rectennas 321 is Pg.

Assuming that the pitch is a period and the relative position is a phase, the period and phase of the R rectenna 311 are fixed in each unit array. On the other hand, there are two G rectennas 321 having the same period and different phases in each unit array. This also applies to B rectennas 331 similarly.

As described above, two G rectennas 321 and two B rectennas 331 having different phases are disposed in every unit array, whereby it is made possible to efficiently receive green light and blue light with which the rectenna array 300 is irradiated.

The pitch of the rectenna (in other words, the pixel pitch) can be made equal to or less than the wavelength of the received light. Taking red color having the longest wavelength as an example, the wavelength is less than 1 micrometer ($\mu m$). Therefore, the pixel pitch can be made less than 1 micrometer ($\mu m$) by using the rectenna. On the other hand, a general solid-state imaging device employing a photodiode has a pixel pitch of about 1 micrometer ($\mu m$). Therefore, as compared with the case of using a photodiode, using a rectenna such as the R rectenna 311 makes it possible to narrow the pixel pitch to reduce the area of the solid-state imaging device 200.

As described above, according to the first embodiment of the present technology, the rectenna array 300 in which a predetermined number of rectennas are arranged is disposed in the solid-state imaging device 200, thereby eliminating the need for optical filters, as compared with the case where photodiodes are arranged. Furthermore, the pixel pitch can be narrowed as compared with the case where photodiodes are arranged. As a result, the size of the solid-state imaging device 200 can be reduced.

[Modifications]

In the first embodiment described above, rectennas such as the R rectenna 311 are disposed along the X direction parallel to one side of the rectenna array 300 and along the Y direction perpendicular to the X direction. However, this arrangement method creates free areas having no rectenna disposed at the four corners of the rectenna array 300, and thus the area efficiency is reduced accordingly. The solid-state imaging device 200 according to a modification of the first embodiment differs from the solid-state imaging device of the first embodiment in that rectennas are arranged along a direction forming an angle of 45 degrees with the X direction to improve the area efficiency.

Figure 9:
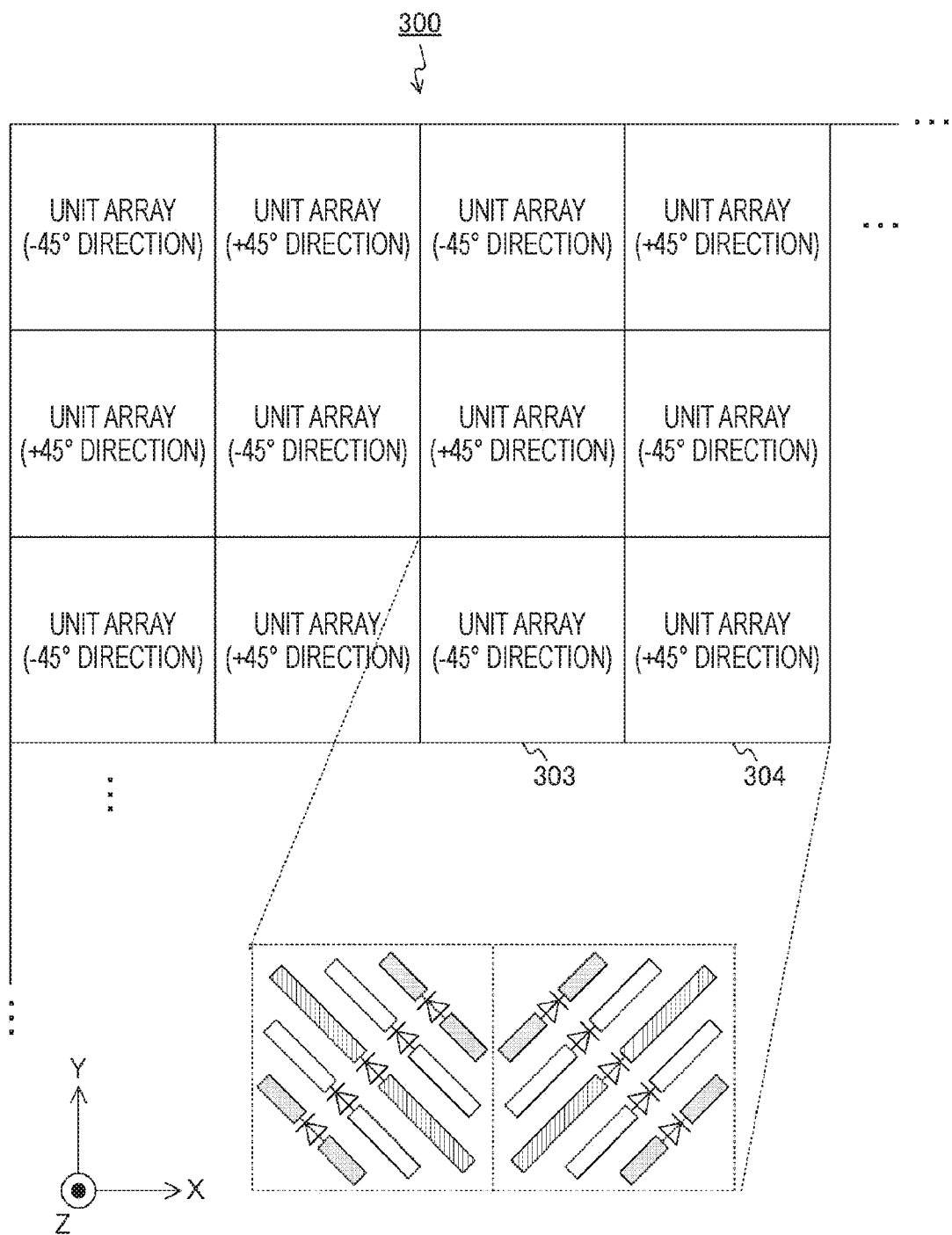
FIG. 9 is an example of a plan view of a rectenna array according to a modification of the first embodiment of the present technology.

FIG. 9 is an example of a plan view of the rectenna array 300 according to the modification of the first embodiment of the present technology. The rectenna array 300 according to the modification of the first embodiment differs from the rectenna array of the first embodiment in that unit arrays 303 and 304 are arranged instead of the horizontal unit array 301 and the vertical unit array 302.

In the unit array 303, a pair of rods are arranged along an oblique direction forming an angle of −45 degrees with the X direction. Furthermore, in the unit array 304, a pair of rods are arranged along an oblique direction forming an angle of +45 degrees with the X direction. As a result of this arrangement, the unit arrays 303 and 304 are each in a square shape. These unit arrays are arranged in a two-dimensional lattice, with the unit arrays 303 and the unit arrays 304 alternately arranged along the X direction and the Y direction.

Thus, in the modification of the first embodiment of the present technology, pairs of rods are arranged along an oblique direction forming an angle of 45 degrees with the X direction parallel to one side of the rectenna array 300, creating no free area at the four corners of the rectenna array 300. As a result, the area efficiency can be improved.

Second Embodiment

In the first embodiment described above, the solid-state imaging device 200 receives visible light such as red, green, and blue light with rectennas. However, the rectenna having a length corresponding to visible light cannot receive ultraviolet light because ultraviolet light is different from visible light in wavelength range. The solid-state imaging device 200 according to the second embodiment differs from the solid-state imaging device of the first embodiment in that a rectenna having a length corresponding to a wavelength of ultraviolet light is additionally disposed.

Figure 10:
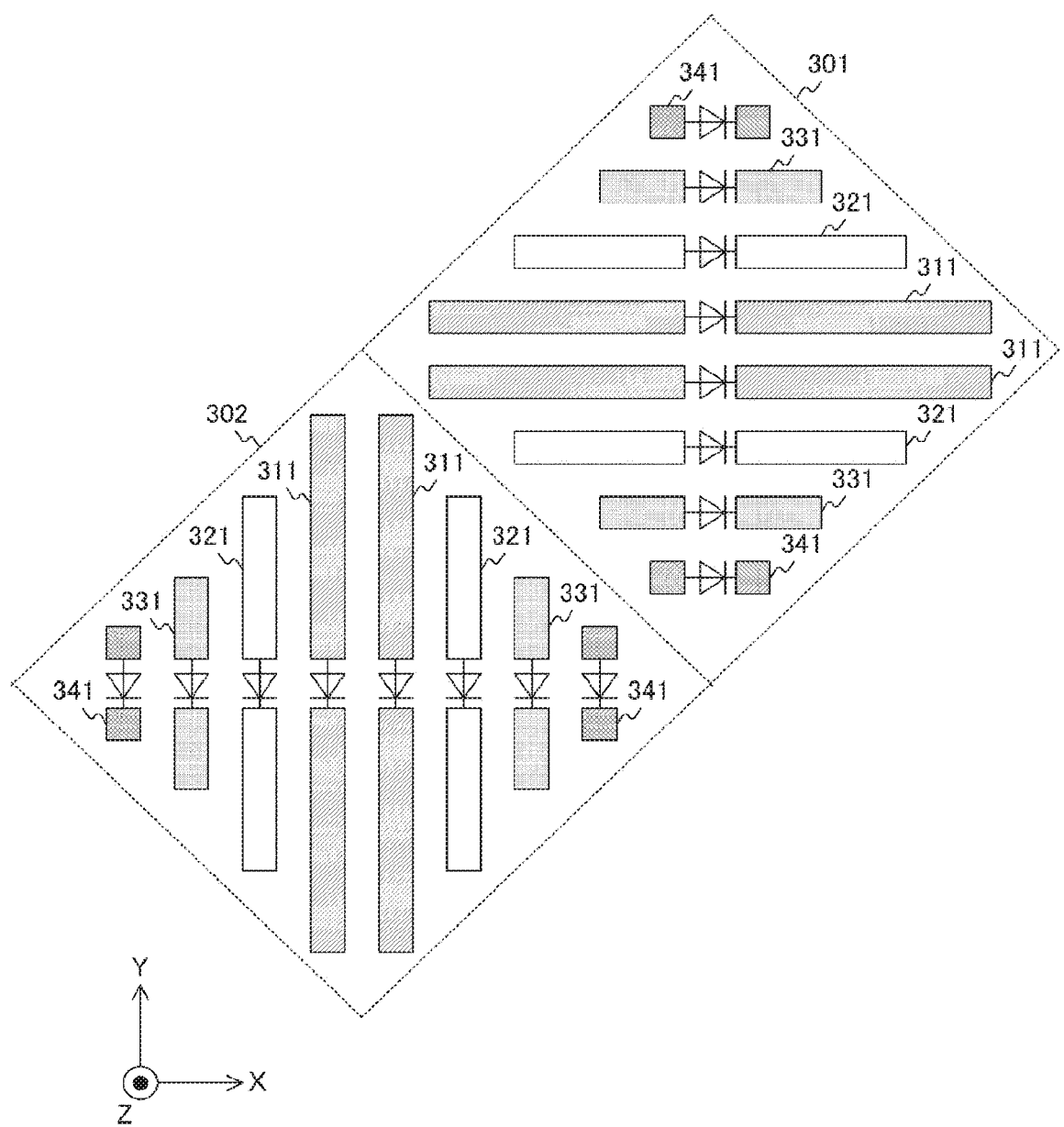
FIG. 10 is an example of an enlarged view of a horizontal unit array and a vertical unit array according to a second embodiment of the present technology.

FIG. 10 is an example of an enlarged view of the horizontal unit array 301 and the vertical unit array 302 according to the second embodiment of the present technology. The horizontal unit array 301 of the second embodiment differs from the horizontal unit array of the first embodiment in that the number of the R rectennas 311 is increased to two and two ultraviolet (UV) rectennas 341 are additionally disposed.

The UV rectenna 341 is a rectenna in a UV rectenna circuit that receives ultraviolet light. In practice, a UV rectenna and a pixel signal generating unit are disposed in the UV rectenna circuit as illustrated in FIG. 4. However, for convenience of description, the pixel signal generating unit is omitted in FIG. 10.

Ultraviolet light has a shorter wavelength than visible light. Therefore, the length of the UV rectenna 341 is less than the length of the B rectenna 331. For higher area efficiency, the two UV rectennas 341 are disposed on both sides of the B rectennas 331, and the position of the center point of the UV rectenna 341 with respect to the X direction is substantially the same as those of the other rectennas. Note that the UV rectenna 341 is an example of the fourth rectifying antenna described in the claims.

Note that rectennas in the vertical unit array 302 are arranged in a similar manner to the rectennas in the horizontal unit array 301 except that pairs of rods are arranged along the Y direction.

Thus, according to the second embodiment of the present technology, the UV rectenna 341 having a length corresponding to a wavelength of ultraviolet light is additionally disposed, whereby ultraviolet light can be further received.

Third Embodiment

In the second embodiment described above, the solid-state imaging device 200 receives visible light and ultraviolet light with rectennas. However, the rectenna having a length corresponding to visible light or ultraviolet light cannot receive infrared light because infrared light is different from visible light and ultraviolet light in wavelength range. The solid-state imaging device 200 according to the second embodiment differs from the solid-state imaging device of the first embodiment in that a rectenna having a length corresponding to a wavelength of infrared light is additionally disposed.

Figure 11:
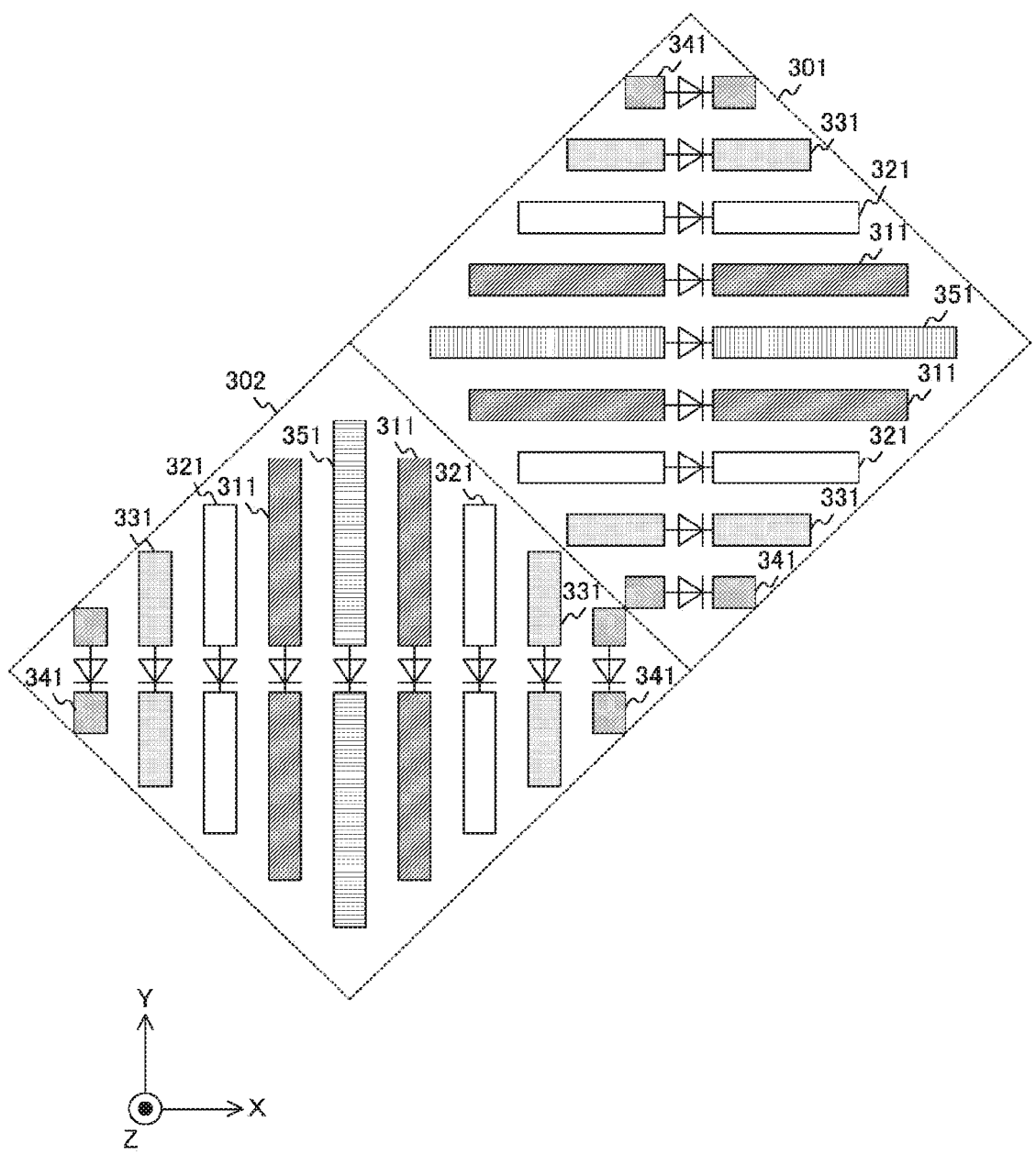
FIG. 11 is an example of an enlarged view of a horizontal unit array and a vertical unit array according to a third embodiment of the present technology.

FIG. 11 is an example of an enlarged view of the horizontal unit array 301 and the vertical unit array 302 according to the third embodiment of the present technology. The horizontal unit array 301 of the third embodiment differs from the horizontal unit array of the first embodiment in that one IR rectenna 351 is additionally disposed.

The IR rectenna 351 is a rectenna in an IR rectenna circuit that receives infrared light. In practice, an IR rectenna and a pixel signal generating unit are disposed in the IR rectenna circuit as illustrated in FIG. 4. However, for convenience of description, the pixel signal generating unit is omitted in FIG. 11.

Infrared light has a longer wavelength than visible light. Therefore, the length of the IR rectenna 351 exceeds the length of the R rectenna 311. For higher area efficiency, the IR rectenna 351 is disposed between two R rectennas 311, and the position of the center point of the IR rectenna 351 with respect to the X direction is substantially the same as those of the other rectennas. Note that the IR rectenna 351 is an example of the fifth rectifying antenna described in the claims.

Note that rectennas in the vertical unit array 302 are arranged in a similar manner to the rectennas in the horizontal unit array 301 except that pairs of rods are arranged along the Y direction.

Furthermore, although both the UV rectenna 341 and the IR rectenna 351 are disposed, it is also possible to select the IR rectenna 351 only to be disposed from the UV rectenna 341 and the IR rectenna 351. Furthermore, it is also possible to additionally dispose a rectenna having a length corresponding to a wavelength of electromagnetic waves (such as microwaves) being different from infrared light, visible light, or ultraviolet light in wavelength range.

Thus, according to the third embodiment of the present technology, the IR rectenna 351 having a length corresponding to a wavelength of infrared light is additionally disposed, whereby infrared light can be further received.

Fourth Embodiment

In the first embodiment described above, both the horizontal unit array 301 and the vertical unit array 302 are in a rhombic shape and arranged diagonally without a gap. However, in a case where white light is further to be received, a photodiode needs to be disposed and difficulty is caused in securing an area for the photodiode. The solid-state imaging device 200 according to the fourth embodiment differs from the solid-state imaging device of the first embodiment in that the area of a unit array is reduced to create a free area.

Figure 12:
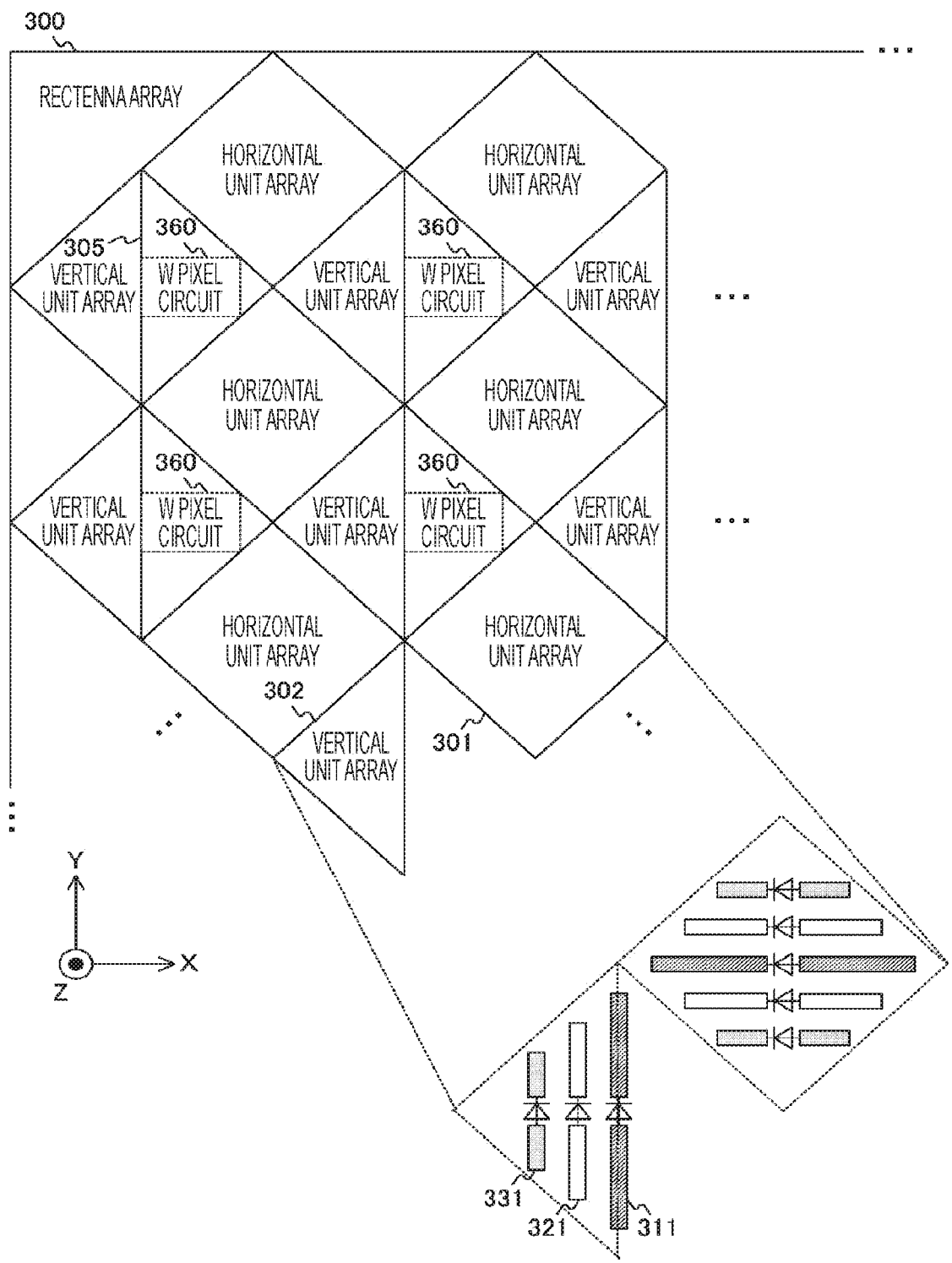
FIG. 12 is an example of a plan view of a rectenna array according to a fourth embodiment of the present technology.

FIG. 12 is an example of a plan view of the rectenna array 300 according to the fourth embodiment of the present technology. The rectenna array 300 of the fourth embodiment differs from the rectenna array of the first embodiment in that the number of the G rectennas 321 and the number of the B rectennas 331 in the vertical unit array 302 are each reduced from two to one. In the vertical unit array 302, the G rectenna 321 is disposed on the left of the R rectenna 311, and the B rectenna 331 is disposed on the left of the G rectenna 321. Furthermore, the positions of the center points of these rectennas are substantially the same with respect to the Y direction. This arrangement makes the vertical unit array 302 be in a triangular shape and creates a triangular free area 305 on the right thereof.

For example, a W pixel circuit 360 is disposed in the free area 305. The W pixel circuit 360 receives white light to generate a pixel signal. Note that the W pixel circuit 360 is an example of the pixel circuit described in the claims.

Note that, in the free area 305, transistors in a rectenna circuit such as the R rectenna circuit 310 may further be disposed in addition to the W pixel circuit 360.

Figure 13:
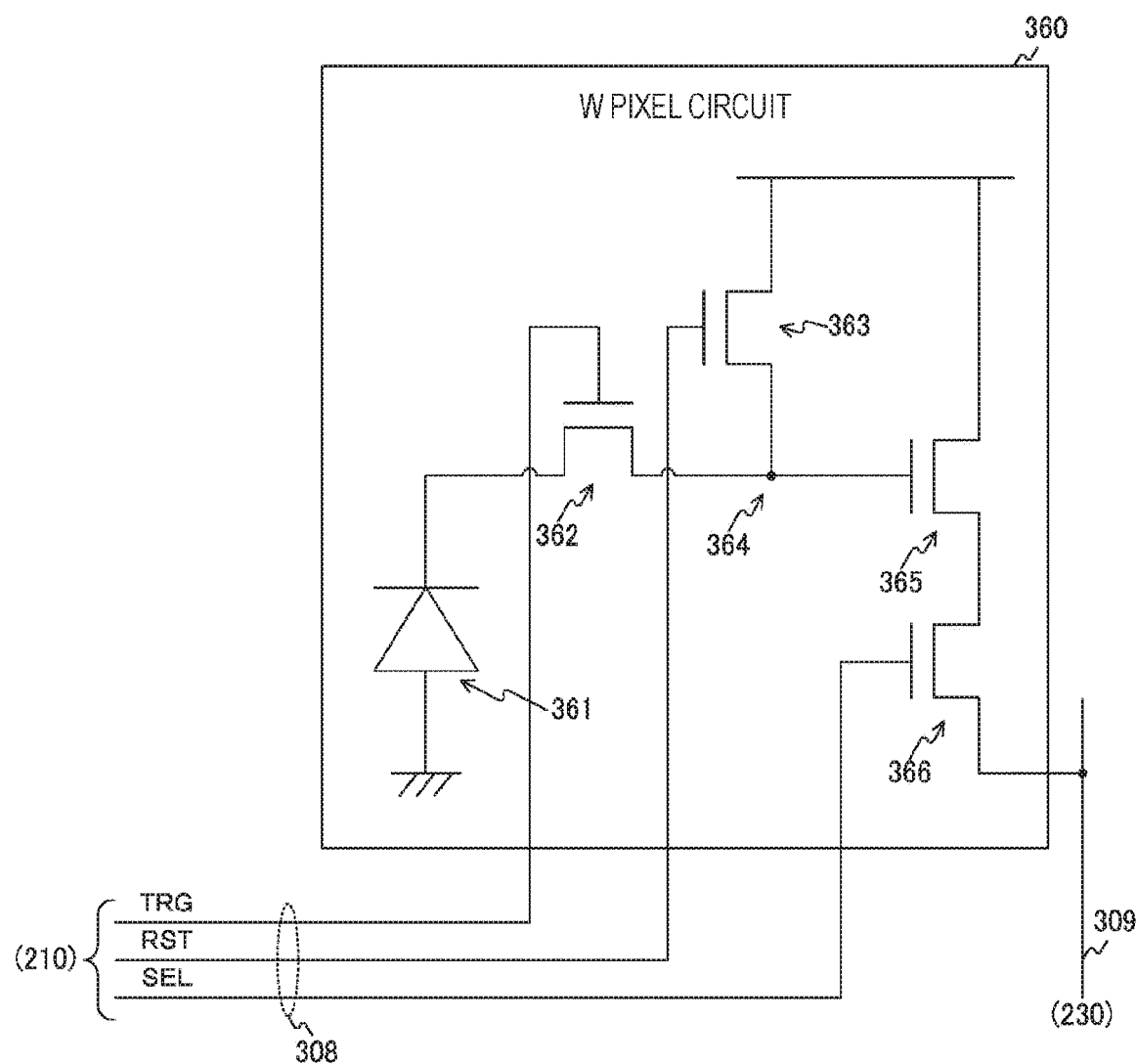
FIG. 13 is a circuit diagram illustrating an example configuration of a white (W) pixel circuit according to the fourth embodiment of the present technology.

FIG. 13 is a circuit diagram illustrating an example configuration of the W pixel circuit 360 according to the fourth embodiment of the present technology. The W pixel circuit 360 includes a photodiode 361, a transfer transistor 362, a reset transistor 363, a floating diffusion layer 364, an amplification transistor 365, and a selection transistor 366. The configuration of elements connection in the W pixel circuit 360 is similar to the configuration of the R rectenna circuit 310 except that the photodiode 361 is disposed instead of the R rectenna 311.

Figure 14:
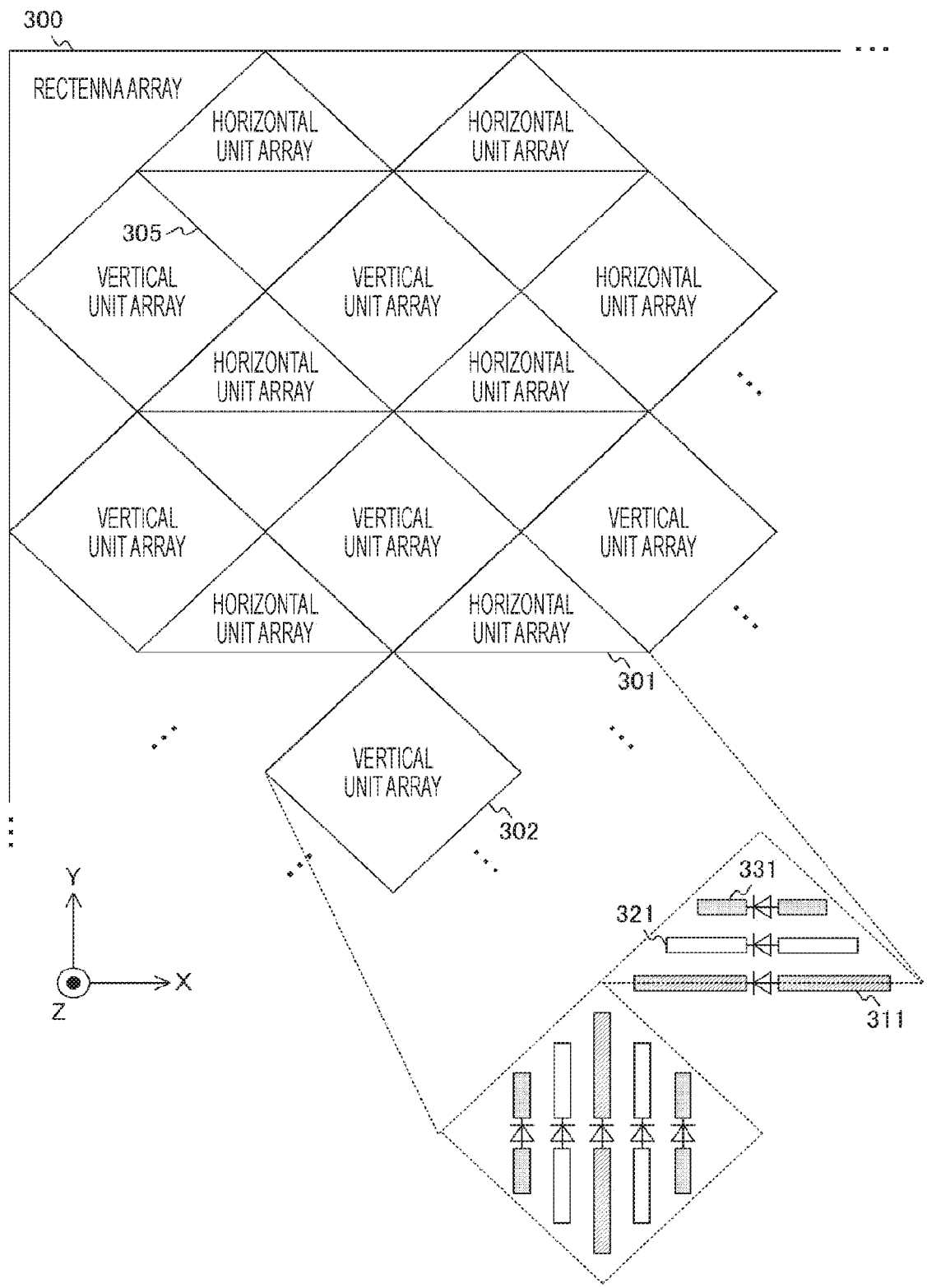
FIG. 14 is an example of a plan view of a rectenna array in which a free area is created in part of the horizontal unit array according to the fourth embodiment of the present technology.

Note that although the area of the vertical unit array 302 is reduced, it is also possible to reduce the area of the horizontal unit array 301 as illustrated in FIG. 14.

As described above, according to the fourth embodiment of the present technology, the area of the vertical unit array 302 is reduced and the W pixel circuit 360 is disposed in the free area 305, making it possible to additionally receive white light.

[First Modification]

In the fourth embodiment described above, visible light is received with rectennas. However, the rectenna having a length corresponding to visible light cannot receive ultraviolet light because ultraviolet light is different from visible light in wavelength range. The solid-state imaging device 200 according to a first modification of the fourth embodiment differs from the solid-state imaging device of the fourth embodiment in that a rectenna having a length corresponding to a wavelength of ultraviolet light is additionally disposed.

Figure 15:
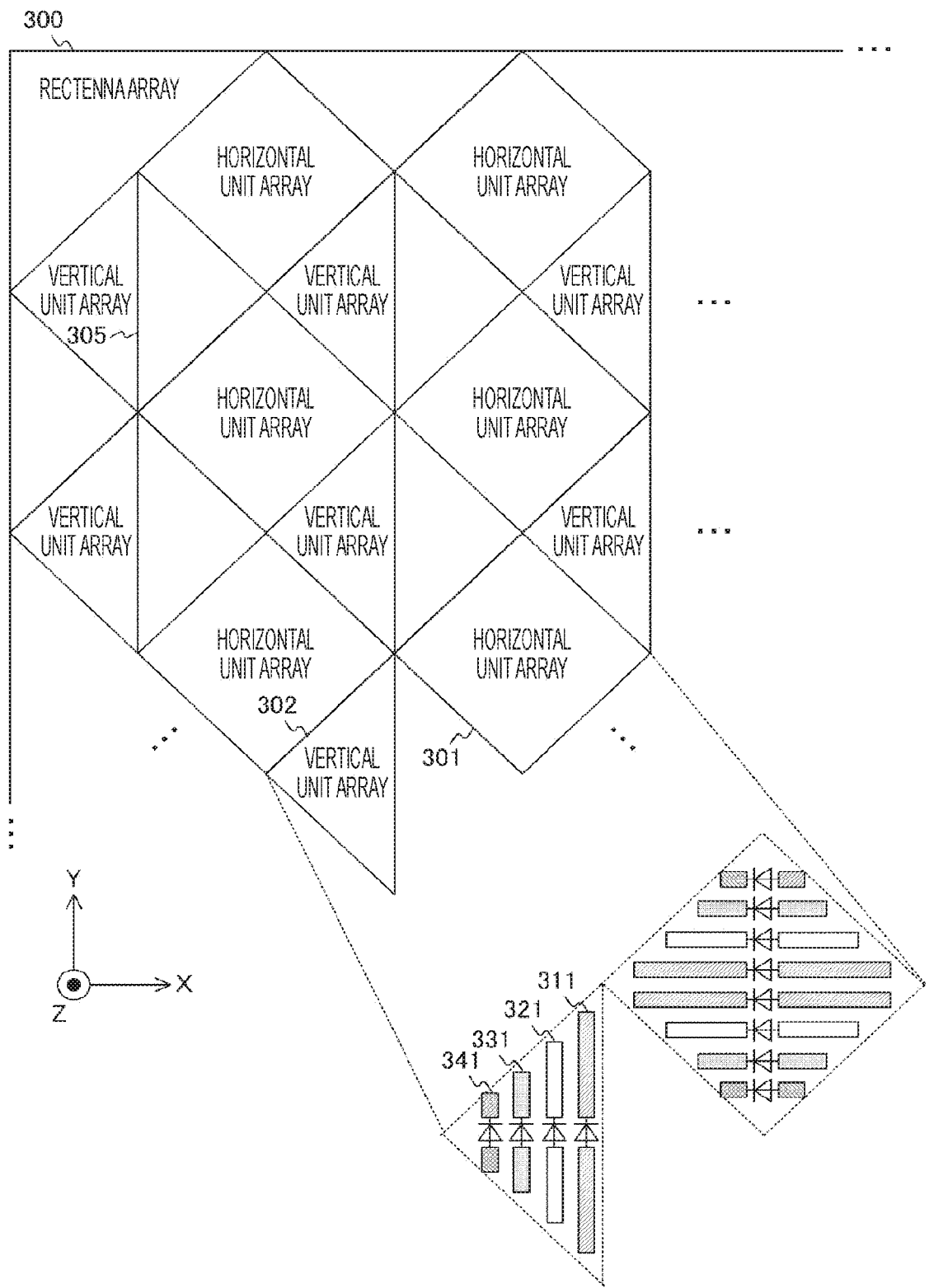
FIG. 15 is an example of a plan view of a rectenna array according to a first modification of the fourth embodiment of the present technology.

FIG. 15 is an example of a plan view of the rectenna array 300 according to the first modification of the fourth embodiment of the present technology. The horizontal unit array 301 of the first modification of the fourth embodiment differs from the horizontal unit array of the fourth embodiment in that the number of the R rectennas 311 is increased to two and two UV rectennas 341 are additionally disposed. In addition, one UV rectenna 341 is further disposed in the vertical unit array 302.

Figure 16:
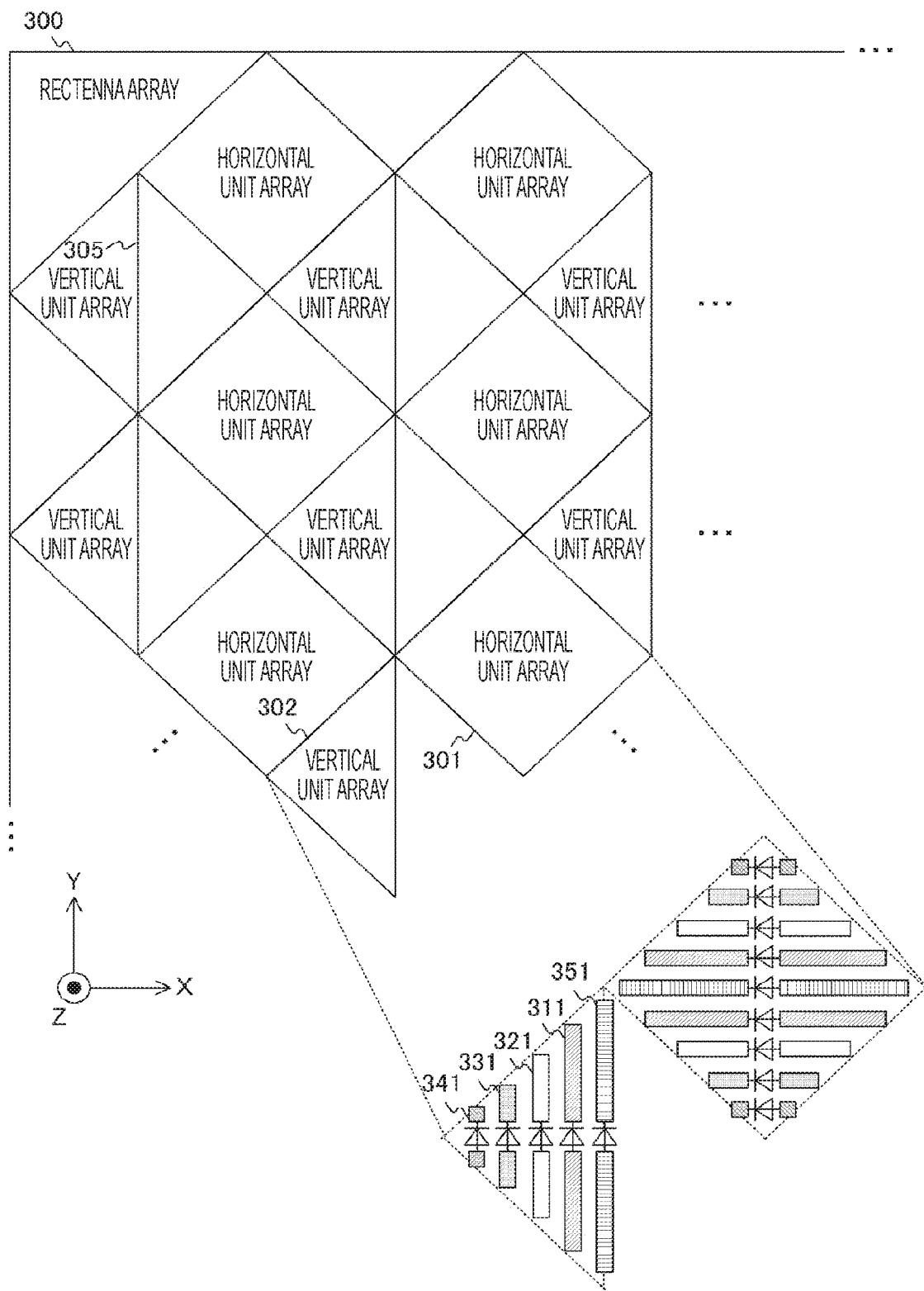
FIG. 16 is an example of a plan view of a rectenna array to which an infrared (IR) rectenna is added to the first modification of the fourth embodiment of the present technology.

Note that the IR rectenna 351 can further be disposed as illustrated in FIG. 16. Furthermore, it is also possible to select the IR rectenna 351 only to be disposed from the UV rectenna 341 and the IR rectenna 351. In addition, the area of the horizontal unit array 301, not the vertical unit array 302, can be reduced instead.

Thus, according to the first modification of the fourth embodiment of the present technology, the UV rectenna 341 having a length corresponding to a wavelength of ultraviolet light is additionally disposed, whereby ultraviolet light can be further received.

[Second Modification]

In the fourth embodiment described above, the area of the vertical unit array 302 is reduced to secure the free area 305. However, there is a possibility that the free area 305 does not have an enough area to contain a photodiode to be disposed therein. The solid-state imaging device 200 according to a second modification of the fourth embodiment differs from the solid-state imaging device of the fourth embodiment in that, in addition to the area of the vertical unit array 302, the area of the horizontal unit array 301 is reduced to extend the area of the free area 305.

Figure 17:
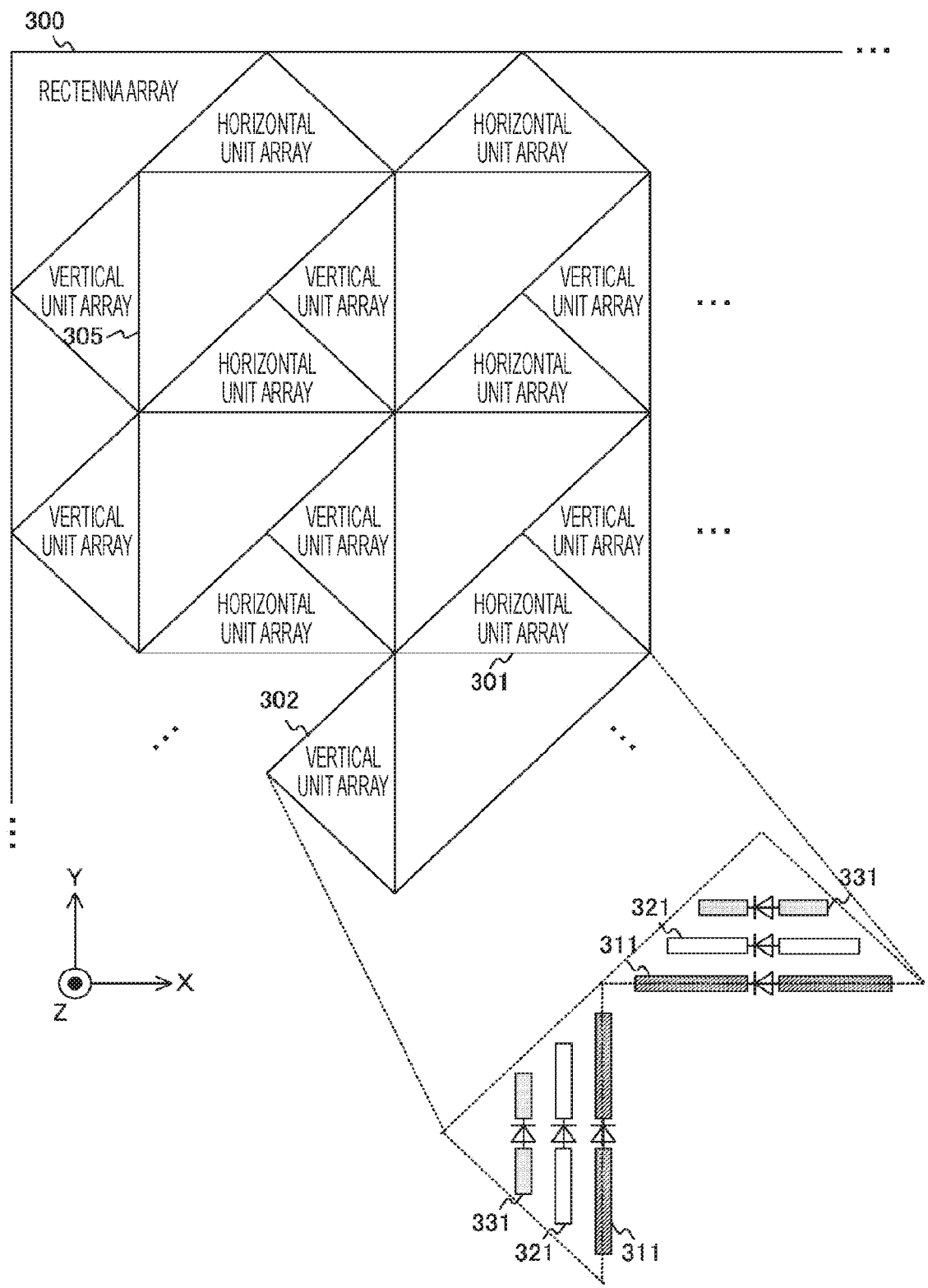
FIG. 17 is an example of a plan view of a rectenna array according to a second modification of the fourth embodiment of the present technology.
Figure 18:
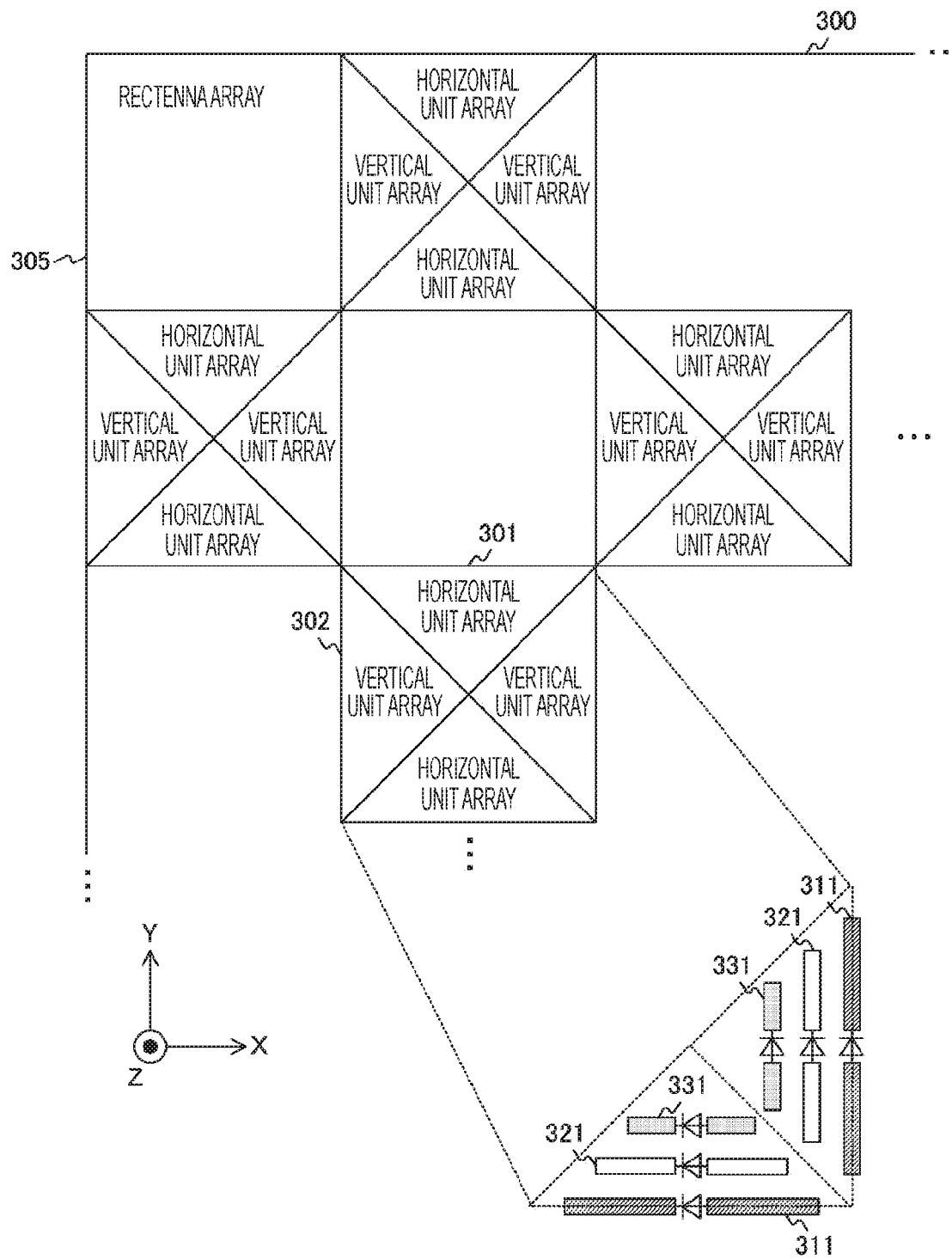
FIG. 18 is an example of a plan view of a rectenna array in which a rectangular free area is provided in the second modification of the fourth embodiment of the present technology.

FIG. 17 is an example of a plan view of the rectenna array 300 according to the second modification of the fourth embodiment of the present technology. The horizontal unit array 301 according to the second modification of the fourth embodiment differs from the horizontal unit array of the fourth embodiment in that, in addition to the area of the vertical unit array 302, the area of the horizontal unit array 301 is reduced. As a result, the area of the free area 305 is twice as large as the area in the fourth embodiment. The pixel circuit 360 and the like are disposed in the free area 305. Furthermore, the free area 305 is in the shape of an isosceles right triangle having a right angle at the upper left corner. Note that another arrangement can also be used to form an isosceles right triangle having a right angle at the lower left corner, the upper right corner, or the lower right corner. Furthermore, as illustrated in FIG. 18, the free area 305 can be in a rectangular shape.

Note that the IR rectenna 351 can be additionally disposed in the second modification of the fourth embodiment. Furthermore, it is also possible to select the IR rectenna 351 only to be disposed from the UV rectenna 341 and the IR rectenna 351.

As described above, according to the second modification of the fourth embodiment of the present technology, the areas of the vertical unit array 302 and the horizontal unit array 301 are reduced, thereby extending the area of the free area 305.

Fifth Embodiment

In the first embodiment described above, the G rectenna circuit 330 is disposed between the B rectenna circuits 320, and the R rectenna circuit 310 is disposed between the G rectenna circuits 320 for higher area efficiency. However, this arrangement is different from a pixel array used for a general solid-state imaging device, such as a Bayer array. Therefore, a process of rearrangement into a Bayer array, for example, is needed during image processing such as demosaicing. The solid-state imaging device 200 according to a fifth embodiment differs from the solid-state imaging device of the first embodiment in that R rectenna circuits 310, G rectenna circuits 320, and B rectenna circuits 330 are arranged in a Bayer array.

Figure 19:
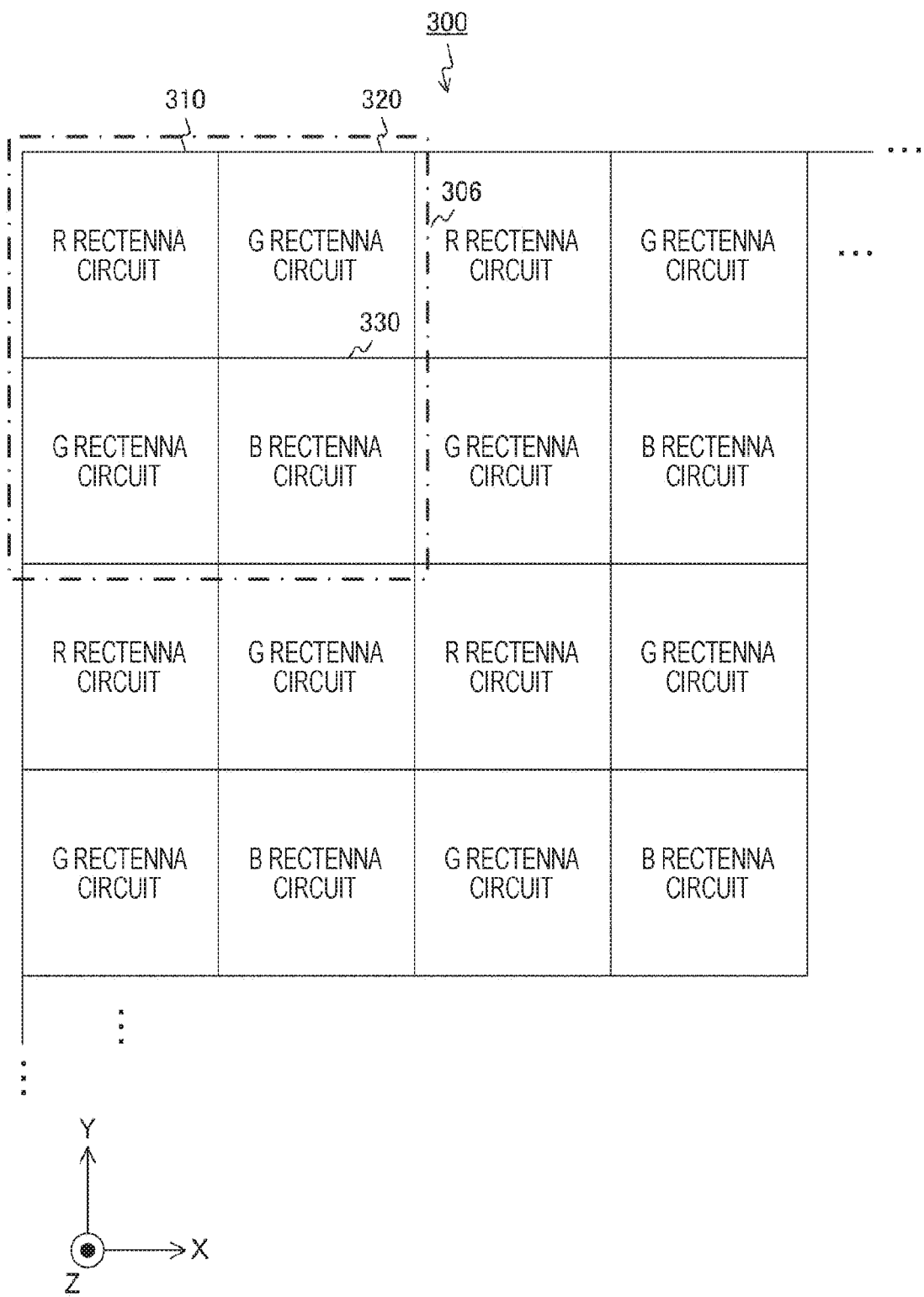
FIG. 19 is an example of a plan view of a rectenna array according to a fifth embodiment of the present technology.

FIG. 19 is an example of a plan view of the rectenna array 300 according to the fifth embodiment of the present technology. The rectenna array 300 according to the fifth embodiment differs from the rectenna array of the first embodiment in that R rectenna circuits 310, G rectenna circuits 320, and B rectenna circuits 330 are arranged in a Bayer array. In this Bayer array, the rectenna array 300 is divided into a plurality of unit blocks 306 each having 2 rows×2 columns. In the unit block 306, the G rectenna circuits 320 are disposed in the lower left and upper right portions, and the R rectenna circuit 310 and the B rectenna circuit 330 are disposed in the remaining portions.

As described above, according to the fifth embodiment of the present technology, R rectenna circuits 310, G rectenna circuits 320, and B rectenna circuits 330 are arranged in a Bayer array, eliminating the need for a process of rearranging the circuits into a Bayer array.

[First Modification]

In the fifth embodiment described above, the solid-state imaging device 200 selectively receives red light, green light, and blue light with rectennas each having a length corresponding to a wavelength. However, since white light has a wide wavelength range, it is difficult for a single rectenna to receive white light. The solid-state imaging device 200 according to a first modification of the fifth embodiment differs from the solid-state imaging device of the fifth embodiment in that the W pixel circuit 360 employing a photodiode is further disposed.

Figure 20:
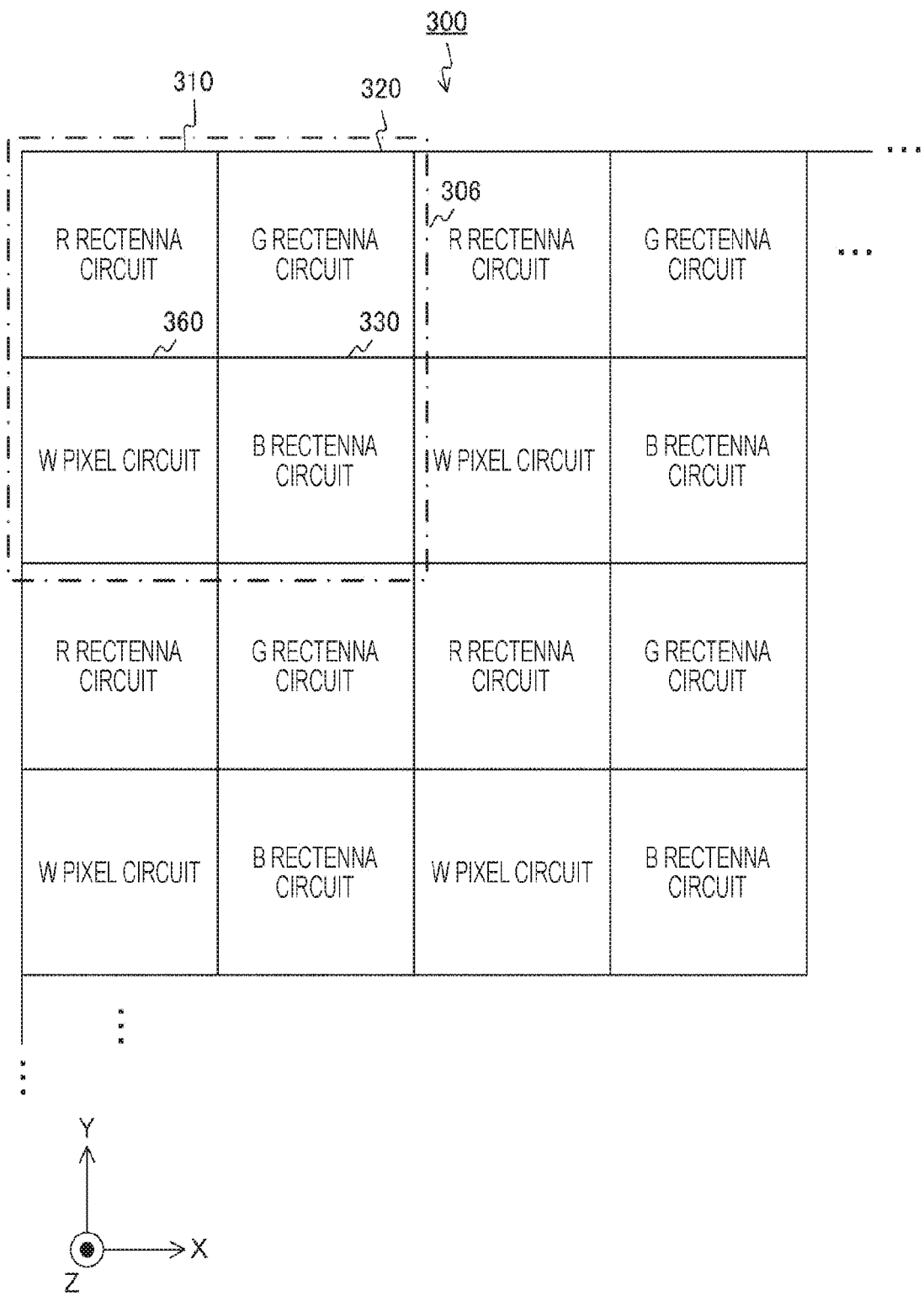
FIG. 20 is an example of a plan view of a rectenna array according to a first modification of the fifth embodiment of the present technology.

FIG. 20 is an example of a plan view of the rectenna array 300 according to the first modification of the fifth embodiment of the present technology. The rectenna array 300 of the first modification of the fifth embodiment differs from the rectenna array of the fifth embodiment in that the W pixel circuit 360 is additionally disposed. In the unit block 306, the R rectenna circuit 310, the G rectenna circuit 320, the B rectenna circuit 330, and the W pixel circuit 360 are disposed one by one.

Thus, according to the first modification of the fifth embodiment of the present technology, the W pixel circuit 360 employing a photodiode is disposed, making it possible to additionally receive white light.

[Second Modification]

In the first modification of the fifth embodiment described above, the solid-state imaging device 200 has the same number of the R rectenna circuits 310, the G rectenna circuits 320, the B rectenna circuits 330, and the W pixel circuits 360. There is a possibility that this arrangement creates image data with insufficient brightness. The solid-state imaging device 200 according to a second modification of the fifth embodiment differs from the solid-state imaging device of the first modification of the fifth embodiment in that the number of the W pixel circuits 360 is doubled.

Figure 21:
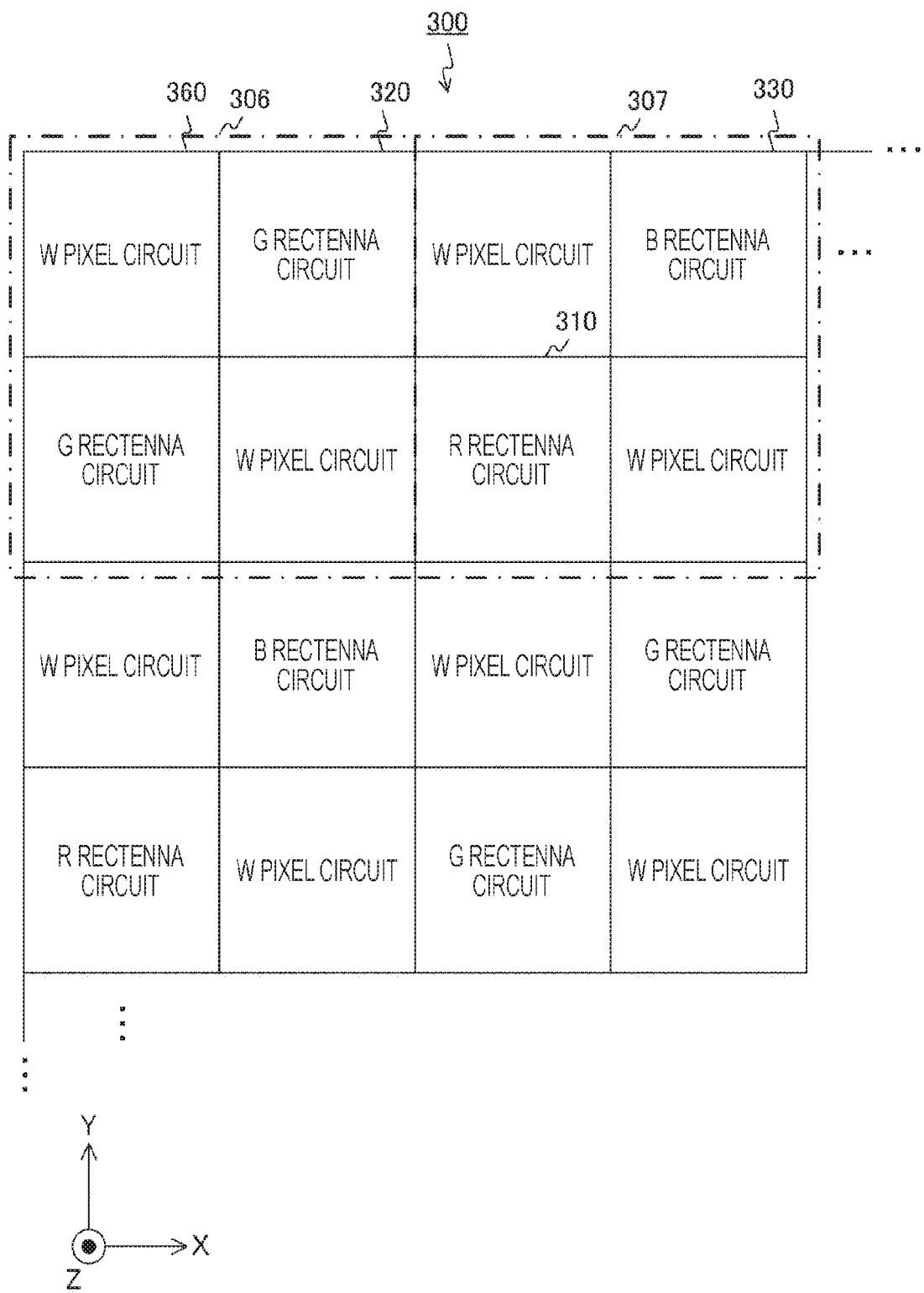
FIG. 21 is an example of a plan view of a rectenna array according to a second modification of the fifth embodiment of the present technology.

FIG. 21 is an example of a plan view of the rectenna array 300 according to the second modification of the fifth embodiment of the present technology. The rectenna array 300 according to the second modification of the fifth embodiment differs from the rectenna array of the first modification of the fifth embodiment in that W pixel circuits 360, the number of which is greater than each of the numbers of the R rectenna circuits 310, the G rectenna circuits 320, and the B rectenna circuits 330, are disposed.

The rectenna array 300 is divided into a plurality of unit blocks 306 each having 2 rows×2 columns and a plurality of unit blocks 307 each having 2 rows×2 columns. In the unit block 306, the G rectenna circuits 320 are disposed in the lower left and upper right portions, and the W pixel circuits 360 are disposed in the remaining portions. Furthermore, in the unit block 307, the R rectenna circuit 310 and the B rectenna circuit 330 are disposed in the lower left portion and the upper right portion, and the W pixel circuits 360 are disposed in the remaining portions. Note that the unit block 306 is an example of the first unit block described in the claims, while the unit block 307 is an example of the second unit block described in the claims.

Figure 22:
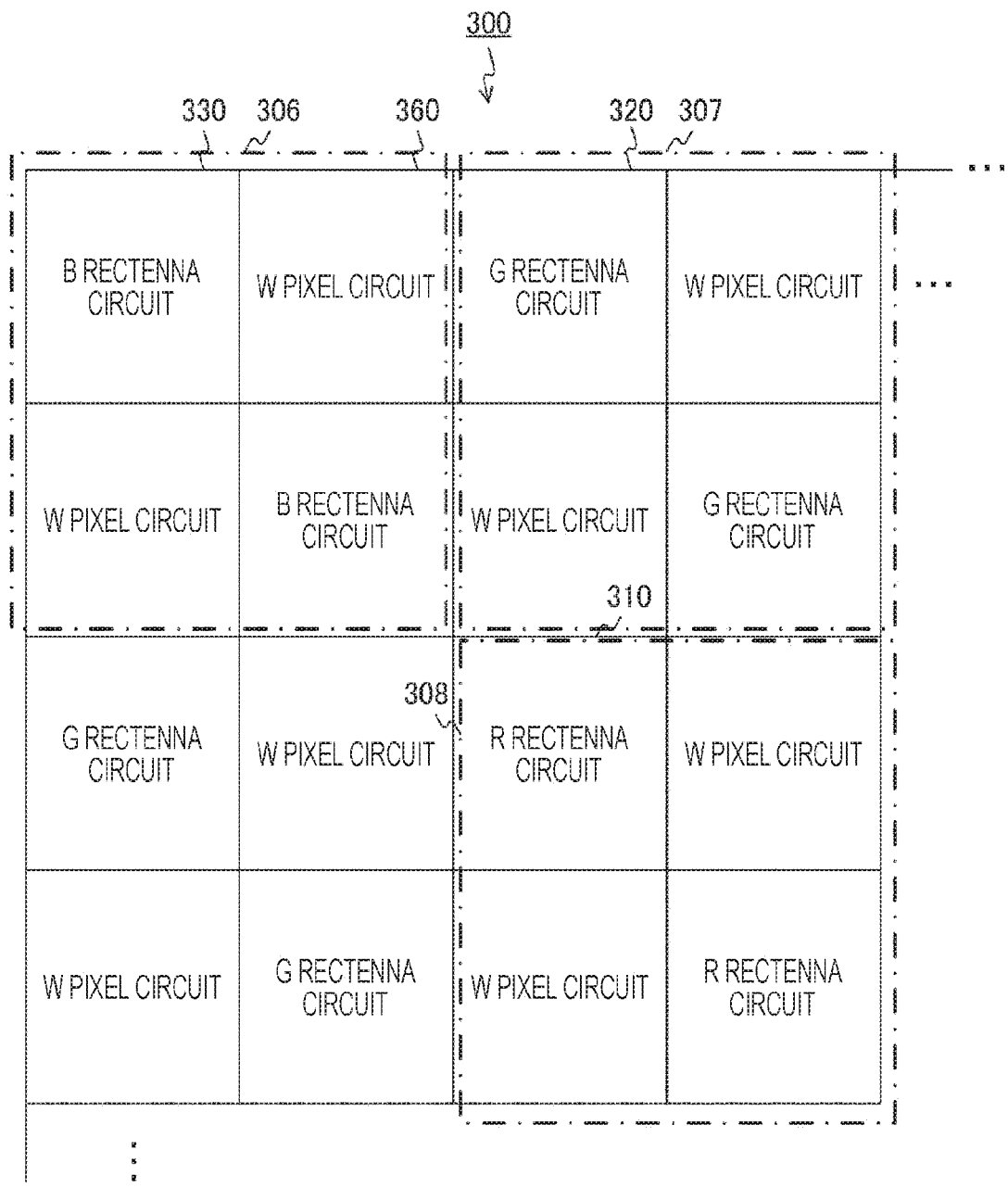
FIG. 22 is an example of a plan view of the rectenna array according to the second modification of the fifth embodiment of the present technology, where the arrangement in the array is changed.

Note that, as illustrated in FIG. 22, it is also possible to divide the rectenna array into a plurality of unit blocks 306 each having 2 rows×2 columns, a plurality of unit blocks 307 each having 2 rows×2 columns, and a plurality of unit blocks 308 each having two rows×2 columns. In the unit block 306, the W pixel circuits 360 are disposed in the lower left and upper right portions, and the B rectenna circuits 330 are disposed in the remaining portions. Furthermore, in the unit block 307, the W pixel circuits 360 are disposed in the lower left and upper right portions, and the G rectenna circuits 320 are disposed in the remaining portions. In the unit block 308, the W pixel circuits 360 are disposed in the lower left and upper right portions, and the R rectenna circuits 310 are disposed in the remaining portions. Note that the unit block 308 is an example of the third unit block described in the claims.

Figure 23:
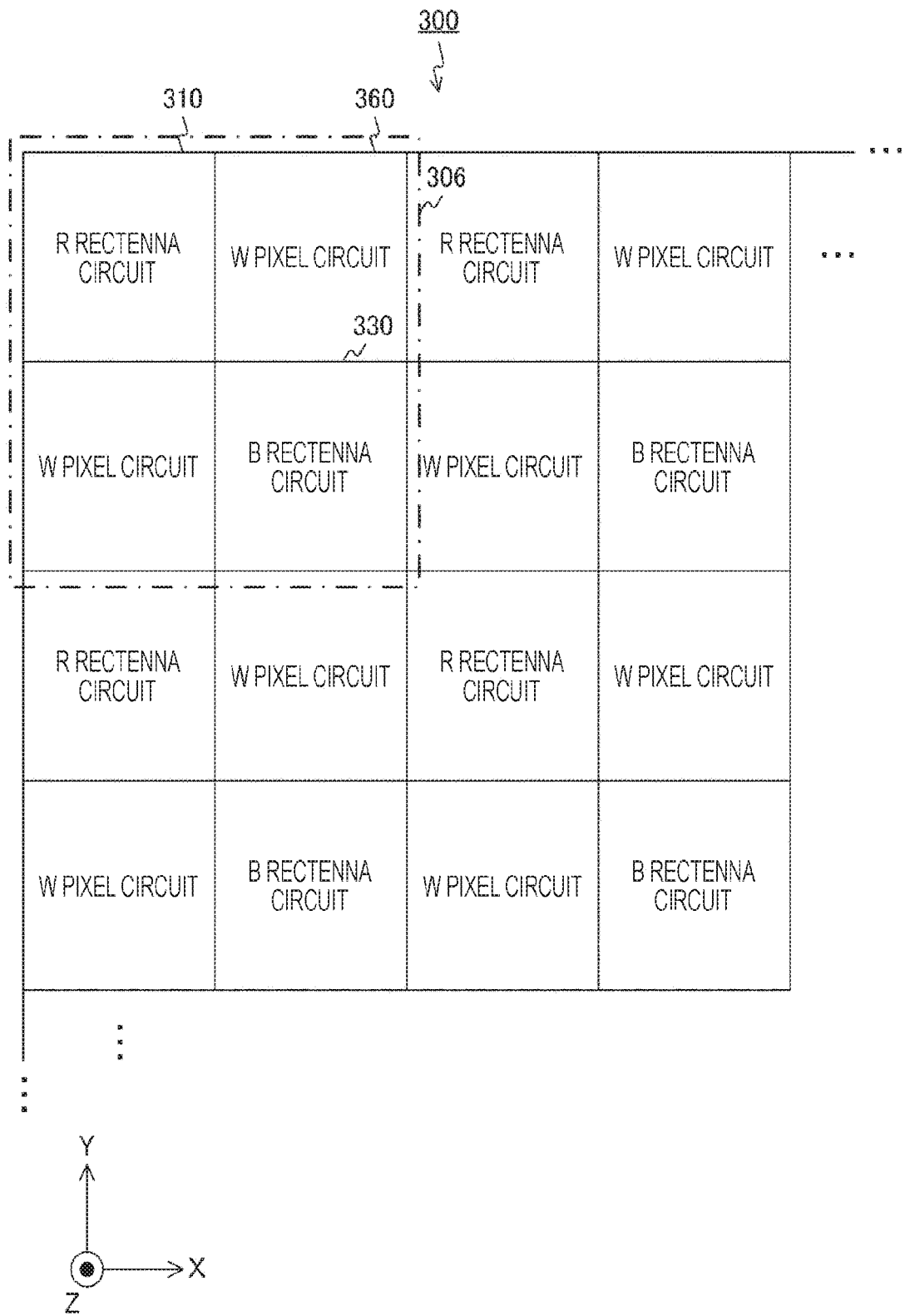
FIG. 23 is an example of a plan view of the rectenna array according to the second modification of the fifth embodiment of the present technology, where the arrangement in the array is further changed.

Furthermore, as illustrated in FIG. 23, it is also possible to divide the rectenna array into a plurality of unit blocks 306 each having 2 rows×2 columns. In the unit block 306, the W pixel circuits 360 are disposed in the lower left and upper right portions, and the R rectenna circuit 310 and the B rectenna circuit 330 are disposed in the remaining portions.

As described above, according to the second modification of the fifth embodiment of the present technology, the number of the W pixel circuits 360 is doubled, whereby the brightness of image data can be increased.

6. Example of Application to Mobile Body

The technology according to the present disclosure (the present technology) can be applied to various products. For example, the technology according to the present disclosure may be implemented in a device provided in any type of mobile object selected from an automobile, an electric vehicle, a hybrid electric vehicle, a motorcycle, a bicycle, a personal mobility, an airplane, a drone, a ship, a robot, and the like.

Figure 24:
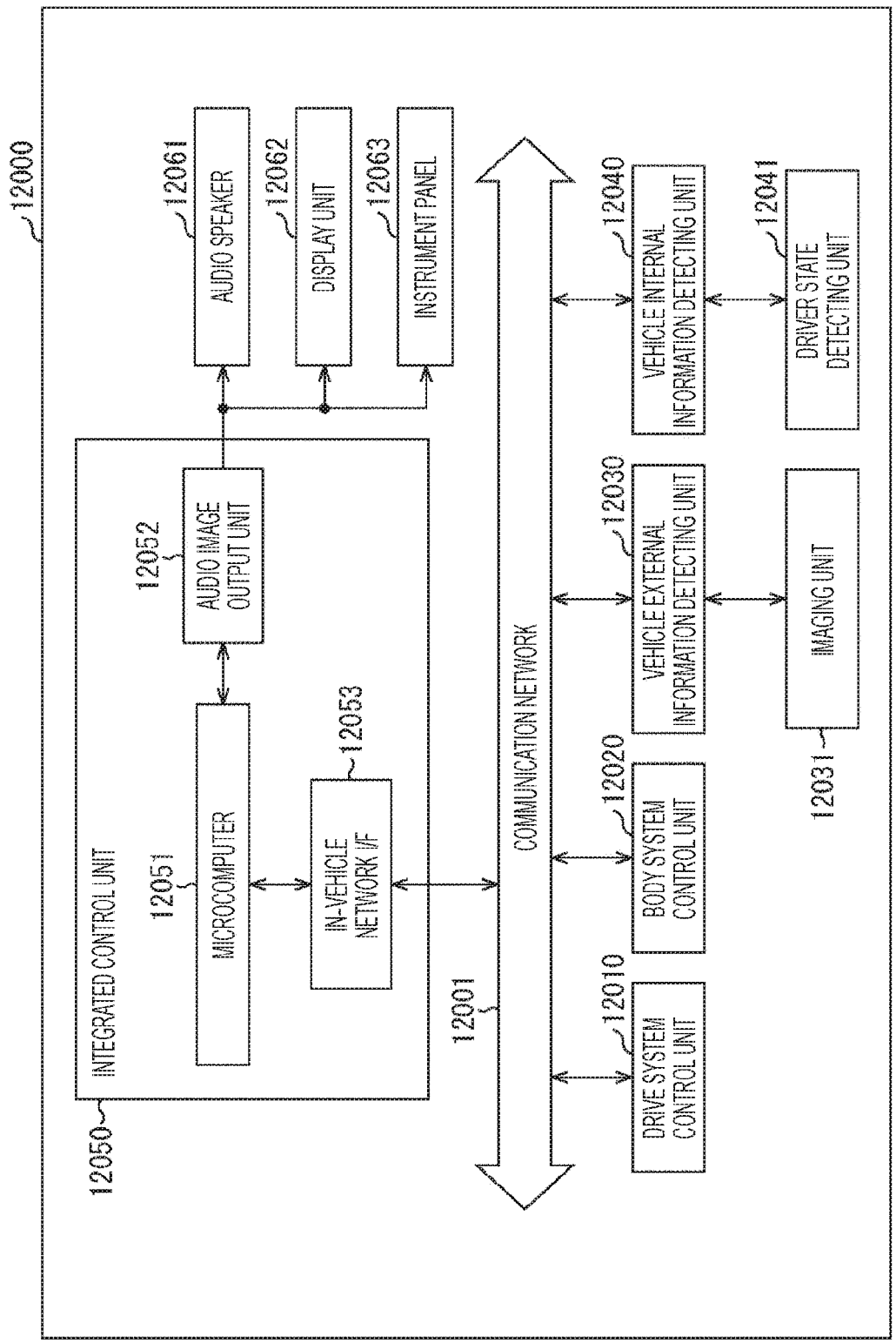
FIG. 24 is a block diagram illustrating a schematic configuration example of a vehicle control system.

FIG. 24 is a block diagram illustrating a schematic configuration example of a vehicle control system, which is an example of a mobile body control system to which the technology according to the present disclosure can be applied.

The vehicle control system 12000 includes a plurality of electronic control units connected via a communication network 12001. In the example illustrated in FIG. 24, the vehicle control system 12000 includes a drive system control unit 12010, a body system control unit 12020, a vehicle external information detecting unit 12030, a vehicle internal information detecting unit 12040, and an integrated control unit 12050. In addition, as a functional configuration of the integrated control unit 12050, a microcomputer 12051, an audio image output unit 12052, and an in-vehicle network interface (I/F) 12053 are illustrated.

The drive system control unit 12010 controls operations of devices related to the drive system of the vehicle in accordance with various programs. For example, the drive system control unit 12010 functions as a control device for a driving force generation device for generating a driving force for an internal combustion engine, a driving motor, or the like, of the vehicle, a driving force transmission mechanism for transmitting a driving force to a wheel, a steering mechanism for adjusting a steering angle of the vehicle, a braking device for generating a braking force of the vehicle, and the like.

The body system control unit 12020 controls operations of various devices provided in the vehicle body in accordance with various programs. For example, the body system control unit 12020 functions as a control device for a keyless entry system, a smart key system, a power window device, or for various lamps such as a head lamp, a back lamp, a brake lamp, a blinker, a fog lamp, or the like. In this case, radio waves transmitted from a mobile device that substitutes for a key or signals of various switches may be input to the body system control unit 12020. The body system control unit 12020 accepts the radio waves or signals that have been input, and controls the door lock device, the power window device, the lamps, and the like of the vehicle.

The vehicle external information detecting unit 12030 detects information regarding the outside of the vehicle in which the vehicle control system 12000 is installed. For example, an imaging unit 12031 is connected to the vehicle external information detecting unit 12030. The vehicle external information detecting unit 12030 causes the imaging unit 12031 to capture an image of the outside of the vehicle and receives the captured image. On the basis of the received image, the vehicle external information detecting unit 12030 may perform a process of detecting an object, such as a person, a vehicle, an obstacle, a sign, or a character on a road surface, or a process of detecting a distance.

The imaging unit 12031 is an optical sensor that receives light and outputs an electric signal corresponding to the amount of the light received. The imaging unit 12031 can output electric signals representing an image, and also can output electric signals representing information regarding distance measurement. Furthermore, the light to be received by the imaging unit 12031 may be visible light or invisible light such as infrared light.

The vehicle internal information detecting unit 12040 detects information regarding the inside of the vehicle. For example, a driver state detecting unit 12041 that detects the state of the driver is connected to the vehicle internal information detecting unit 12040. The driver state detecting unit 12041 may include, for example, a camera that captures images of the driver. On the basis of the detection information that is input from the driver state detecting unit 12041, the vehicle internal information detecting unit 12040 may calculate the degree of fatigue or the degree of concentration of the driver or may determine whether or not the driver is dozing.

The microcomputer 12051 is capable of calculating a control target value for the driving force generation device, the steering mechanism, or the braking device on the basis of the information regarding the inside or outside of the vehicle as acquired by the vehicle external information detecting unit 12030 or the vehicle internal information detecting unit 12040, and of outputting a control command to the drive system control unit 12010. For example, the microcomputer 12051 is capable of performing cooperative control for fulfilling functions of advanced driver assistance systems (ADAS) including collision avoidance or shock mitigation of the vehicle, following travel based on an inter-vehicle distance, vehicle-speed maintained traveling, vehicle collision warning, vehicle lane departure warning, and the like.

Furthermore, the microcomputer 12051 is capable of performing cooperative control for automated driving and the like in which the vehicle autonomously travels without relying on driver's operations, by controlling the driving force generation device, the steering mechanism, the braking device, or the like on the basis of the information regarding surroundings of the vehicle as acquired by the vehicle external information detecting unit 12030 or the vehicle internal information detecting unit 12040.

Furthermore, the microcomputer 12051 is capable of outputting a control command to the body system control unit 12020 on the basis of the information regarding the outside of the vehicle as acquired by the vehicle external information detecting unit 12030. For example, the microcomputer 12051 is capable of performing cooperative control to prevent dazzling by, for example, controlling the headlamps in accordance with the position of a preceding vehicle or oncoming vehicle detected by the vehicle external information detecting unit 12030 to switch from the high beam to the low beam.

The audio image output unit 12052 transmits an output signal, which is at least one of a sound or an image, to an output device that can visually or auditorily give notification of information to an occupant of the vehicle or to the outside of the vehicle. In the example in FIG. 24, an audio speaker 12061, a display unit 12062, and an instrument panel 12063 are illustrated as the output device. The display unit 12062 may include, for example, at least one of an on-board display or a head-up display.

Figure 25:
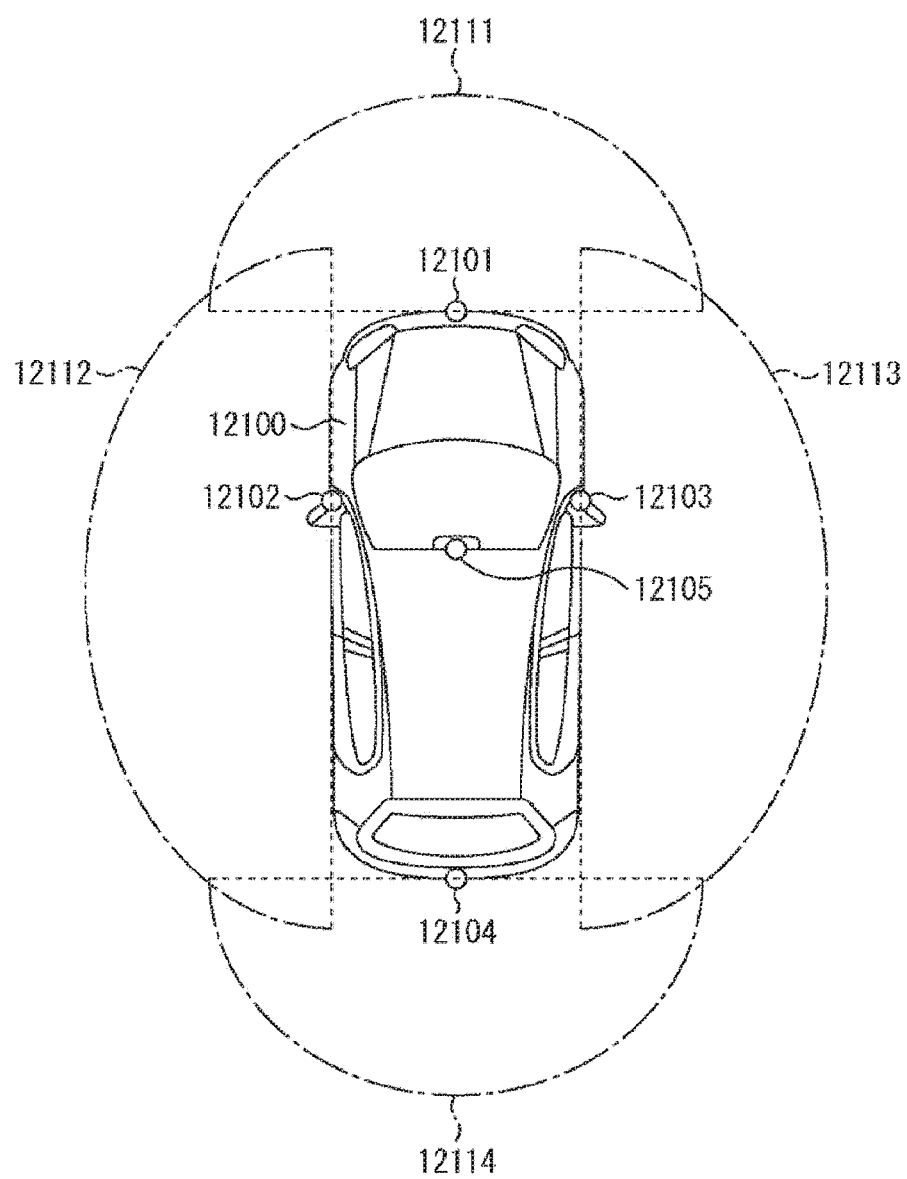
FIG. 25 is an explanatory diagram illustrating an example of the position where an imaging unit is installed.

FIG. 25 is diagram showing example positions at which the imaging unit 12031 is disposed.

In FIG. 25, imaging units 12101, 12102, 12103, 12104, and 12105 are provided as the imaging unit 12031.

The imaging units 12101, 12102, 12103, 12104, and 12105 are disposed in, for example, a front nose, a side mirror, a rear bumper, a back door, an upper portion of a windshield in a vehicle interior, and the like of the vehicle 12100. The imaging unit 12101 disposed in the front nose and the imaging unit 12105 disposed in an upper portion of the windshield in the vehicle interior mainly acquire images of a region in front of the vehicle 12100. The imaging units 12102 and 12103 disposed in the side mirrors mainly acquire images of a region on either side of the vehicle 12100. The imaging unit 12104 disposed in the rear bumper or the back door mainly acquires images of a region on the back of the vehicle 12100. The imaging unit 12105 disposed in an upper portion of the windshield in the vehicle interior is mainly used for detecting a preceding vehicle, a pedestrian, an obstacle, a traffic signal, a traffic sign, a lane, or the like.

Note that FIG. 25 shows an example of imaging ranges of the imaging units 12101 to 12104. An imaging range 12111 indicates an imaging range of the imaging unit 12101 disposed in the front nose, imaging ranges 12112 and 12113 indicate imaging ranges of the imaging units 12102 and 12103, respectively, disposed in the side mirrors, and an imaging range 12114 indicates an imaging range of the imaging unit 12104 disposed in the rear bumper or the back door. For example, pieces of image data captured by the imaging units 12101 to 12104 are superimposed so that a bird's-eye image of the vehicle 12100 seen from above can be obtained.

At least one of the imaging units 12101 to 12104 may have a function of acquiring distance information. For example, at least one of the imaging units 12101 to 12104 may be a stereo camera including a plurality of imaging elements or may be an imaging element having pixels to detect a phase difference.

For example, by obtaining a distance to each of solid objects in the imaging ranges 12111 to 12114 and a temporal change in the distance (relative speed to the vehicle 12100) on the basis of the distance information acquired from the imaging units 12101 to 12104, the microcomputer 12051 can extract a solid object that is on the traveling route of the vehicle 12100, positioned closest to the vehicle 12100, and travelling at a predetermined speed (for example, equal to or higher than 0 km/h) in a direction substantially the same as the direction in which the vehicle 12100 is travelling, as a preceding vehicle. Moreover, the microcomputer 12051 can set a distance between vehicles to be secured beforehand in front of the preceding vehicle and perform automatic brake control (including following stop control), automatic acceleration control (including following start control), and the like. In this way, cooperative control can be performed for automated driving and the like by which the vehicle autonomously travels without relying on driver's operations.

For example, on the basis of the distance information acquired from the imaging units 12101 to 12104, the microcomputer 12051 can classify solid object data regarding solid objects into two-wheeled vehicle, regular vehicle, large vehicle, pedestrian, utility pole or the like, and other solid objects to extract data, and can use the extracted data to automatically avoid an obstacle. For example, the microcomputer 12051 identifies an obstacle around the vehicle 12100 either as an obstacle that can be visually recognized by the driver of the vehicle 12100 or as an obstacle that is difficult for the driver to visually recognize. Then, the microcomputer 12051 determines a collision risk indicating the degree of risk of collision with each obstacle and, when the collision risk is equal to or higher than a predetermined value and the vehicle can possibly collide with the obstacle, the microcomputer 12051 can assist driving for collision avoidance by outputting a warning to the driver via the audio speaker 12061 or the display unit 12062 or by performing forced deceleration or avoidance steering via the drive system control unit 12010.

At least one of the imaging units 12101 to 12104 may be an infrared camera that detects infrared light. For example, the microcomputer 12051 can recognize a pedestrian by determining whether or not a pedestrian is present in images captured by the imaging units 12101 to 12104. Recognition of a pedestrian is performed by, for example, a procedure of extracting feature points in images captured by the imaging units 12101 to 12104 as an infrared camera and a procedure of performing a pattern matching process on a series of feature points indicating the contour of an object to determine whether or not the object is a pedestrian. When the microcomputer 12051 determines that a pedestrian is present in images captured by the imaging units 12101 to 12104 and recognizes the pedestrian, the audio image output unit 12052 controls the display unit 12062 to display a superimposed rectangular outline to emphasize the recognized pedestrian. Furthermore, the audio image output unit 12052 may control the display unit 12062 to display an icon or the like indicating the pedestrian at a desired position.

The foregoing has described an example of the vehicle control system to which the technology according to the present disclosure may be applied. The technology according to the present disclosure may be applied to the imaging unit 12031 among the above-described components. Specifically, the electronic apparatus 100 in FIG. 1 can be applied to the imaging unit 12031. By applying the technology according to the present disclosure to the imaging unit 12031, the size of the imaging unit 12031 can be reduced.

Note that the embodiments described above are examples for embodying the present technology, and the matters in the embodiments and the matters specifying the invention in the claims respectively have correspondence relationships. Likewise, the matters specifying the invention in the claims and the matters, which are denoted by names identical to the matters specifying the invention, in the embodiments of the present technology respectively have correspondence relationships. However, the present technology is not limited to the embodiments, and the present technology can be embodied by making various modifications to the embodiments without departing from the gist of the present technology.

Note that the effects described herein are merely examples and are not restrictive, and other effects may be provided.

Note that the present technology can have the following configurations.

(1) An array antenna including:
a first rectifying antenna; and
a second rectifying antenna that differs from the first rectifying antenna in shape.

(2) The array antenna according to (1), in which the first rectifying antenna and the second rectifying antenna are arranged on a predetermined plane.

(3) The array antenna according to (1) or (2), further including:
a third rectifying antenna that differs from the first rectifying antenna and the second rectifying antenna in shape.

(4) The array antenna according to (3), further including:

a fourth rectifying antenna that differs from the first rectifying antenna, the second rectifying antenna, and the third rectifying antenna in shape.

(5) The array antenna according to (4), further including:

a fifth rectifying antenna that differs from the first rectifying antenna, the second rectifying antenna, the third rectifying antenna, and the fourth rectifying antenna in shape.

(6) The array antenna according to any one of (1) to (5), in which the array antenna is divided into a first unit array and a second unit array, each of the first rectifying antenna and the second rectifying antenna includes a pair of rods, the first rectifying antenna and the second rectifying antenna are disposed in each of the first unit array and the second unit array, in the first unit array, the pair of rods are arranged along a predetermined direction, and in the second unit array, the pair of rods are arranged along a direction perpendicular to the predetermined direction.

(7) The array antenna according to (6), in which the array antenna is rectangular, and the predetermined direction is a direction parallel to one side of the array antenna.

(8) The array antenna according to (6), in which the array antenna is rectangular, and the predetermined direction forms an angle of 45 degrees with one side of the array antenna.

(9) The array antenna according to any one of (6) to (8), in which in at least one of the first unit array or the second unit array, the second rectifying antennas, the number of which is at least two, are disposed, and the first rectifying antenna is longer than each of the second rectifying antennas and is disposed between the second rectifying antennas.

(10) The array antenna according to any one of (6) to (9), in which one of the first unit array and the second unit array is in a rectangular shape and the other one is in a triangular shape.

(11) The array antenna according to any one of (6) to (9), in which each of the first unit array and the second unit array is in a triangular shape.

(12) The array antenna according to (11), in which a free area in which no rectifying antenna is disposed is further provided, and the free area is in a triangular shape.

(13) The array antenna according to (11), in which a free area in which no rectifying antenna is disposed is further provided, and the free area is in a rectangular shape.

(14) The array antenna according to (1), further including:

a third rectifying antenna that differs from the first rectifying antenna and the second rectifying antenna in shape, in which the first rectifying antenna receives red light, the second rectifying antenna receives green light, the third rectifying antenna receives blue light, and the first rectifying antenna, the second rectifying antenna, and the third rectifying antenna are arranged in a Bayer array.

(15) The array antenna according to (1), further including:

a third rectifying antenna that differs from the first rectifying antenna and the second rectifying antenna in shape; and a pixel circuit that receives white light, in which the first rectifying antenna receives red light, the second rectifying antenna receives green light, and the third rectifying antenna receives blue light.

(16) The array antenna according to (15), in which the array antenna is divided into a plurality of unit blocks, and the first rectifying antenna, the second rectifying antenna, the third rectifying antenna, and the pixel circuit are arranged in a two-dimensional lattice in each of the plurality of unit blocks.

(17) The array antenna according to (15), in which the array antenna is divided into a plurality of first unit blocks and a plurality of second unit blocks, the first rectifying antenna, the third rectifying antenna, and a pair of the pixel circuits are arranged in a two-dimensional lattice in each of the plurality of first unit blocks, and a pair of the second rectifying antennas and a pair of the pixel circuits are arranged in a two-dimensional lattice in each of the plurality of second unit blocks.

(18) The array antenna according to (15), in which the array antenna is divided into a plurality of first unit blocks, a plurality of second unit blocks, and a plurality of third unit blocks, a pair of the first rectifying antennas and a pair of the pixel circuits are arranged in a two-dimensional lattice in each of the plurality of first unit blocks, a pair of the second rectifying antennas and a pair of the pixel circuits are arranged in a two-dimensional lattice in each of the plurality of second unit blocks, and a pair of the third rectifying antennas and a pair of the pixel circuits are arranged in a two-dimensional lattice in each of the plurality of third unit blocks.

(19) The array antenna according to (1), further including:

a pixel circuit that receives white light, in which the array antenna is divided into a plurality of unit blocks, the first rectifying antenna receives red light, the second rectifying antenna receives blue light, and the first rectifying antenna, the second rectifying antenna, and a pair of the pixel circuits are arranged in a two-dimensional lattice in each of the plurality of unit blocks.

(20) A solid-state imaging device including an array antenna in which a predetermined number of rectifying antennas are arranged.

(21) The solid-state imaging device according to (20), in which a plurality of rectifying antenna circuits is arranged in the array antenna, each of the plurality of rectifying antenna circuits includes:

the rectifying antenna; and a pixel signal generating unit, and the pixel signal generating unit includes:

a floating diffusion layer that accumulates charge and generates a voltage corresponding to the amount of charge;

a transfer transistor that transfers the charge from the rectifying antenna to the floating diffusion layer in accordance with a transfer signal;

a reset transistor that initializes the amount of charge in the floating diffusion layer in accordance with a reset signal;

an amplification transistor that amplifies the voltage; and a selection transistor that outputs a signal of the voltage that has been amplified as a pixel signal in accordance with a selection signal.

(22) An electronic apparatus including:

an array antenna in which a plurality of rectifying antenna circuits is arranged; and a signal processing unit that processes a pixel signal generated by each of the plurality of rectifying antenna circuits.

REFERENCE SIGNS LIST

100 Electronic apparatus
111 Optical unit
112 Image processing unit
113 Display unit
114 Codec processing unit
115 Storage unit
116 Output unit
117 Communication unit
120 Operation unit
130 Control unit
140 Drive
150 Removable medium
200 Solid-state imaging device
210 Vertical scanning unit
220 Timing control unit
230 AD converting unit
240 Signal processing unit
300 Rectenna array
310 R rectenna circuit
311 R rectenna
312 Dipole antenna
313 Schottky diode
314 Pixel signal generating unit
315, 362 Transfer transistor
316, 363 Reset transistor
317, 364 Floating diffusion layer
318, 365 Amplification transistor
319, 366 Selection transistor
320 G rectenna circuit
321 G rectenna
330 B rectenna circuit
331 B rectenna
341 UV rectenna
351 IR rectenna
360 W pixel circuit
361 Photodiode
401 Metal
402 Silicon dioxide layer
403 Capacitance
404 Polysilicon substrate

The invention claimed is:

1. An array antenna, comprising:
a first rectifying antenna; and
a second rectifying antenna that differs from the first rectifying antenna in shape, wherein
the array antenna is divided into a first unit array and a second unit array,
the first rectifying antenna includes a first pair of rods,
the second rectifying antenna includes a second pair of rods,
the first rectifying antenna and the second rectifying antenna are in each of the first unit array and the second unit array,
in the first unit array, the first pair of rods is arranged along a first direction,
in the second unit array, the second pair of rods is arranged along a second direction, and
the second direction is perpendicular to the first direction.

2. The array antenna according to claim 1, wherein the first rectifying antenna and the second rectifying antenna are arranged on a specific plane.

3. The array antenna according to claim 1, further comprising:
a third rectifying antenna that differs from each of the first rectifying antenna and the second rectifying antenna in shape.

4. The array antenna according to claim 3, further comprising:
a fourth rectifying antenna that differs from each of the first rectifying antenna, the second rectifying antenna, and the third rectifying antenna in shape.

5. The array antenna according to claim 4, further comprising:
a fifth rectifying antenna that differs from each of the first rectifying antenna, the second rectifying antenna, the third rectifying antenna, and the fourth rectifying antenna in shape.

6. The array antenna according to claim 1, wherein
the array antenna is rectangular, and
the first direction is a direction parallel to one side of the array antenna.

7. The array antenna according to claim 1, wherein
the array antenna is rectangular, and
the first direction forms an angle of 45 degrees with one side of the array antenna.

8. The array antenna according to claim 1, wherein
a specific rectifying antenna, having a shape similar to the second rectifying antenna, is in at least one of the first unit array or the second unit array,
the first rectifying antenna is longer than each of the second rectifying antenna and the specific rectifying antenna, and
the first rectifying antenna is between the second rectifying antenna and the specific rectifying antenna.

9. The array antenna according to claim 1, wherein
the first unit array is in a rectangular shape and the second unit array is in a triangular shape, or
the first unit array is in the triangular shape and the second unit array is in the rectangular shape.

10. The array antenna according to claim 1, wherein each of the first unit array and the second unit array is in a triangular shape.

11. The array antenna according to claim 10, wherein a free area in which there is no rectifying antenna is further provided, and the free area is in a triangular shape.

12. The array antenna according to claim 10, wherein a free area in which there is no rectifying antenna is further provided, and the free area is in a rectangular shape.

* * * * *